United States Patent
Katsuno et al.

(10) Patent No.: US 8,513,687 B2
(45) Date of Patent: Aug. 20, 2013

(54) SEMICONDUCTOR LIGHT EMITTING DEVICE AND SEMICONDUCTOR LIGHT EMITTING APPARATUS

(75) Inventors: Hiroshi Katsuno, Tokyo (JP); Yasuo Ohba, Kanagawa-ken (JP); Kei Kaneko, Kanagawa-ken (JP); Mitsuhiro Kushibe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 751 days.

(21) Appl. No.: 12/548,939

(22) Filed: Aug. 27, 2009

(65) Prior Publication Data

US 2010/0051994 A1   Mar. 4, 2010

(30) Foreign Application Priority Data

Aug. 28, 2008   (JP) ................................. 2008-220145

(51) Int. Cl.
*H01L 33/00*   (2010.01)

(52) U.S. Cl.
USPC   257/98; 257/99; 257/E33.062; 257/E33.063; 257/E33.064; 257/E33.065; 257/E33.067; 257/E33.068; 438/22; 438/46; 438/47

(58) Field of Classification Search
None
See application file for complete search history.

(56) References Cited

U.S. PATENT DOCUMENTS

| | | | | |
|---|---|---|---|---|
| 6,194,743 B1 * | 2/2001 | Kondoh et al. | ................. | 257/94 |
| 7,067,340 B1 * | 6/2006 | Tsai et al. | ........................ | 438/47 |
| 7,173,288 B2 * | 2/2007 | Lee et al. | ......................... | 257/94 |
| 7,176,479 B2 | 2/2007 | Ohba | | |
| 2002/0197764 A1 * | 12/2002 | Uemura et al. | ................. | 438/79 |
| 2003/0006409 A1 | 1/2003 | Ohba | | |
| 2005/0269588 A1 * | 12/2005 | Kim et al. | ........................ | 257/99 |
| 2006/0060880 A1 * | 3/2006 | Lee et al. | ......................... | 257/99 |
| 2007/0034883 A1 | 2/2007 | Ohba | | |
| 2009/0050916 A1 | 2/2009 | Katsuno et al. | | |

FOREIGN PATENT DOCUMENTS

| | | |
|---|---|---|
| JP | 2000-031588 A | 1/2000 |
| JP | 2002-151739 A | 5/2002 |
| JP | 2005-116794 | 4/2005 |

(Continued)

OTHER PUBLICATIONS

U.S. Appl. No. 12/505,053, filed Jul. 17, 2009, Kei Kaneko et al.

(Continued)

*Primary Examiner* — Hrayr A Sayadian
(74) *Attorney, Agent, or Firm* — Oblon, Spivak, McClelland, Maier & Neustadt, L.L.P.

(57) ABSTRACT

A semiconductor light emitting device, includes: a stacked structure unit including a first semiconductor layer, a second semiconductor layer, and a light emitting layer provided between the first semiconductor layer and the second semiconductor layer; a first electrode provided on a first major surface of the stacked structure unit on the second semiconductor layer side to connect to the first semiconductor layer; and a second electrode provided on the first major surface of the stacked structure unit to connect to the second semiconductor layer. The second electrode includes: a first film provided on the second semiconductor layer; and a second film provided on a rim of the first film on the second semiconductor layer. The first film has a relatively low contact resistance with the second semiconductor layer. The second film has a relatively high contact resistance with the second semiconductor layer. A distance from an outer edge of the second film to the first film is smaller at a central portion than at a peripheral portion of the first major surface.

9 Claims, 14 Drawing Sheets

(56) References Cited

FOREIGN PATENT DOCUMENTS

| | | |
|---|---|---|
| JP | 2005-191552 A | 7/2005 |
| JP | 2006-41403 A | 2/2006 |
| JP | 2006-229187 | 8/2006 |
| JP | 2006-245231 A | 9/2006 |
| JP | 2007-27539 A | 2/2007 |
| JP | 2007-243219 A | 9/2007 |
| JP | 2008-78432 A | 4/2008 |

OTHER PUBLICATIONS

Japanese Office Action issued May 16, 2012 in Patent Application No. 2008-220145 with English Translation.

* cited by examiner

SEMICONDUCTOR LIGHT EMITTING DEVICE AND SEMICONDUCTOR LIGHT EMITTING APPARATUS

CROSS-REFERENCE TO RELATED APPLICATIONS

This application is based upon and claims the benefit of priority from the prior Japanese Patent Application No. 2008-220145, filed on Aug. 28, 2008; the entire contents of which are incorporated herein by reference.

BACKGROUND OF THE INVENTION

1. Field of the Invention

This invention relates to a semiconductor light emitting device and a semiconductor light emitting apparatus.

2. Background Art

Flip-chip semiconductor light emitting devices are being developed for devices such as LEDs (Light Emitting Diodes) as structures promising high heat dissipation and high light extraction efficiency. In such structures, the light emitting layer side of the wafer contacts the heat sink, and the emitted light is extracted from the substrate side directly or by reflections by a reflecting film.

Technology for forming high-efficiency reflecting films is essential for flip-chip semiconductor light emitting devices. Silver and aluminum are drawing attention as reflecting film candidates to realize light emitting devices of high luminance by efficiently reflecting light produced by the light emitting layer, particularly light in the ultraviolet band.

Silver particularly provides ohmic contact with a p-type nitride semiconductor layer and is utilized in flip-chip semiconductor light emitting devices as p-side electrodes/reflecting films. However, aluminum having high reflecting characteristics does not exhibit ohmic properties, and electrical characteristics are therefore sacrificed.

Conversely, a structure in JP-A 2005-116794 (Kokai) attempts to realize both electrical characteristics and reflecting characteristics using subdivided ohmic electrodes provided on a contact layer with reflecting layers formed therebetween.

Generally, in the case where light emitted inside a flip-chip semiconductor light emitting device is extracted to the exterior, the light extraction efficiency is better as the light emitting region is proximal to the central portion of the semiconductor light emitting device. The more proximal to the central portion, the lesser the effects of the device end face, and therefore the better the light output reproducibility. On the other hand, to increase the light extraction efficiency, it is advantageous to design a large reflecting region of the electrode formation surface, and it is desirable to provide reflecting regions also in regions other than the central portion. In other words, a tradeoff exists in providing the light emitting region in the central portion of the device and making the reflecting region as large as possible, and limitations have been reached for improving both at the same time.

Conventional art such as JP-A 2005-116794 (Kokai) has not sufficiently investigated planar configurations of ohmic electrodes and reflecting films. There is room for improvement of light extraction efficiency and light output reproducibility.

SUMMARY OF THE INVENTION

According to an aspect of the invention, there is provided a semiconductor light emitting device, including: a stacked structure unit including a first semiconductor layer, a second semiconductor layer, and a light emitting layer provided between the first semiconductor layer and the second semiconductor layer; a first electrode provided on a first major surface of the stacked structure unit on the second semiconductor layer side to connect to the first semiconductor layer; and a second electrode provided on the first major surface of the stacked structure unit to connect to the second semiconductor layer, the second electrode including: a first film provided on the second semiconductor layer, the first film having a relatively low contact resistance with the second semiconductor layer; and a second film provided on a rim of the first film on the second semiconductor layer, the second film having a relatively high contact resistance with the second semiconductor layer, a distance from an outer edge of the second film to the first film being smaller at a central portion than at a peripheral portion of the first major surface.

According to another aspect of the invention, there is provided a semiconductor light emitting device, including: a stacked structure unit including a first semiconductor layer, a second semiconductor layer, and a light emitting layer provided between the first semiconductor layer and the second semiconductor layer; a first electrode provided on a first major surface of the stacked structure unit on the second semiconductor layer side to connect to the first semiconductor layer; and a second electrode provided on the first major surface of the stacked structure unit to connect to the second semiconductor layer, the second electrode including: a first film provided on the second semiconductor layer, the first film having a relatively low contact resistance with the second semiconductor layer; and a second film provided on a rim of the first film on the second semiconductor layer, the second film having a relatively high contact resistance with the second semiconductor layer, a distance from an outer edge of the second film to the first film being larger at a portion other than a portion where the first electrode and the second electrode oppose each other than at the portion where the first electrode and the second electrode oppose each other.

According to another aspect of the invention, there is provided a semiconductor light emitting apparatus, including: a semiconductor light emitting device; and a fluorescent body absorbing a first light emitted from the semiconductor light emitting device and emitting a second light having a wavelength different from a wavelength of the first light, the semiconductor light emitting device including: a stacked structure unit including a first semiconductor layer, a second semiconductor layer, and a light emitting layer provided between the first semiconductor layer and the second semiconductor layer; a first electrode provided on a first major surface of the stacked structure unit on the second semiconductor layer side to connect to the first semiconductor layer; and a second electrode provided on the first major surface of the stacked structure unit to connect to the second semiconductor layer, the second electrode including: a first film provided on the second semiconductor layer, the first film having a relatively low contact resistance with the second semiconductor layer; and a second film provided on a rim of the first film on the second semiconductor layer, the second film having a relatively high contact resistance with the second semiconductor layer, a distance from an outer edge of the second film to the first film being smaller at a central portion than at a peripheral portion of the first major surface.

DETAILED DESCRIPTION OF THE INVENTION

Figure 1A:
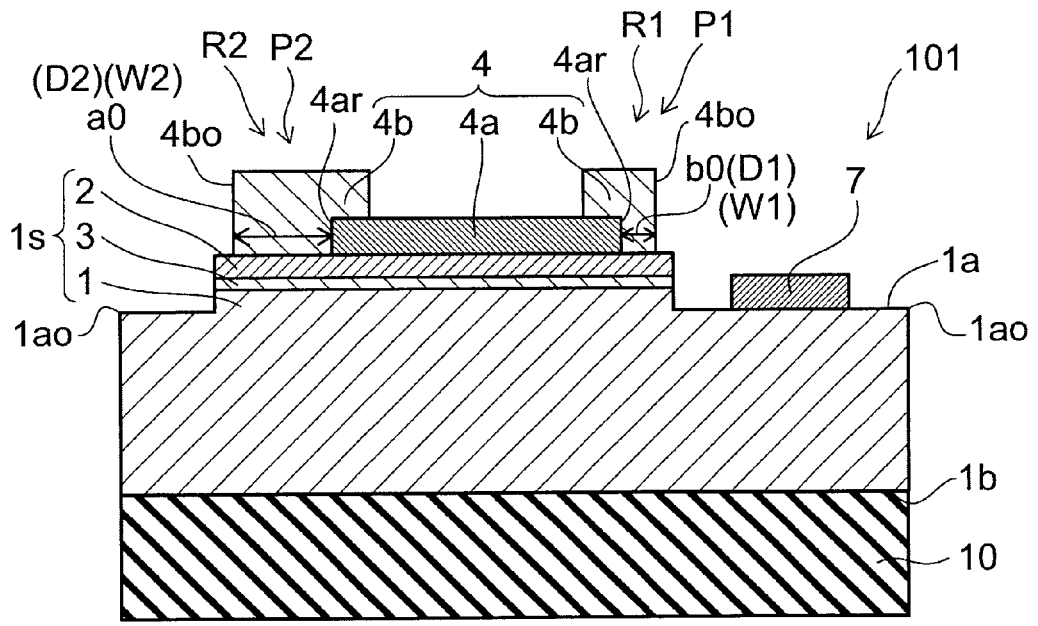
FIGS. 1A and 1B are schematic views illustrating the configuration of a semiconductor light emitting device according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
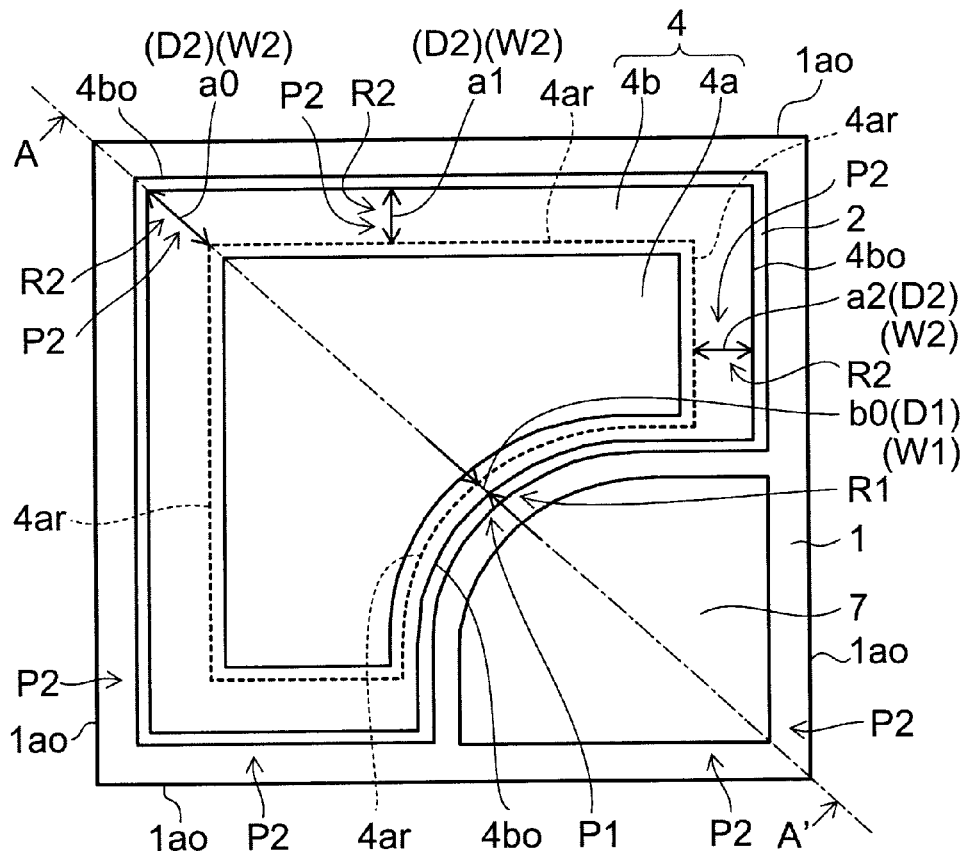

FIGS. 1A and 1B are schematic views illustrating the configuration of a semiconductor light emitting device according to a first embodiment of the invention.

Namely, FIG. 1B is a plan view, and FIG. 1A is a cross-sectional view along line A-A' of FIG. 1B.

A semiconductor light emitting device 101 according to the first embodiment of the invention illustrated in FIGS. 1A and 1B includes: a stacked structure unit is including an n-type semiconductor layer (first semiconductor layer) 1, a p-type semiconductor layer (second semiconductor layer) 2, and a light emitting layer 3 provided between the n-type semiconductor layer 1 and the p-type semiconductor layer 2; an n-side electrode (first electrode) 7 provided on a first major surface 1a of the stacked structure unit 1s on the p-type semiconductor layer 2 side to connect to the n-type semiconductor layer 1; and a p-side electrode (second electrode) 4 provided on the first major surface 1a of the stacked structure unit 1s to connect to the p-type semiconductor layer 2.

The p-side electrode 4 includes a first film 4a provided on the p-type semiconductor layer 2. The first film 4a has good ohmic connection characteristics and a low contact resistance with the p-type semiconductor layer 2. The p-side electrode 4 also includes a second film 4b provided on a rim 4ar of the first film 4a on the p-type semiconductor layer 2. The second film 4b has low ohmic connection characteristics or non-ohmic connection characteristics and a high contact resistance with the p-type semiconductor layer 2.

A distance (a first distance 01) from an outer edge 4bo of the second film 4b to the first film 4a is smaller at a central portion (a first portion P1, i.e., a first region R1) than a distance (a second distance D2) at a peripheral portion (a second portion P2, i.e., a second region R2) of the first major surface 1a.

In this specific example, the planar configuration of the semiconductor light emitting device 101 is substantially rectangular.

The distance from the outer edge of the second film 4b to the first film 4a of the peripheral portion of the semiconductor light emitting device 101 may include a width a0 on the diagonal line of the rectangle, a width a1 in the vertical direction of the rectangle, and a width a2 in the horizontal direction of the rectangle.

The central portion of the semiconductor light emitting device 101 of this specific example is a portion distal from the peripheral portion (an outer edge 1ao of the first major surface 1a) of the rectangle of the semiconductor light emitting device 101 where the p-side electrode 4 and the n-side electrode 7 oppose each other. Namely, the distance from the outer edge of the second film 4b to the first film 4a at the central portion of the semiconductor light emitting device 101 is a width b0.

The width b0 (a first width W1) of the central portion is narrower than the width a0, the width a1, and the width a2 of the peripheral portion (i.e., then a second width W2).

Thus, the first film 4a, which has good ohmic connection characteristics, can be disposed at the central portion of the semiconductor light emitting device 101 by making the distance (the width b0) from the outer edge of the second film 4b to the first film 4a at the central portion narrower than the distance (the width a0, the width a1, and the width a2) from the outer edge of the second film 4b to the first film 4a at the peripheral portion of the semiconductor light emitting device 101. Thereby, the light emitting region can be disposed in the central portion of the semiconductor light emitting device 101.

By disposing the second film 4b having reflecting characteristics around the edge portion of the first film 4a having good ohmic connection characteristics, the reflecting region can be formed by the first film 4a and the second film 4b, and the surface area of the entire reflecting region can be enlarged.

In other words, current is restricted to the first film 4a portion, and the surface area of the entire reflecting region is enlarged while disposing the light emitting region in the central portion.

In this specific example, the distance from the outer edge of the second film 4b to the first film 4a is larger at the portion other than the portion where the n-side electrode 7 and the p-side electrode 4 oppose each other, that is, for example, at the peripheral portion of the semiconductor light emitting device 101, than at the portion where the n-side electrode 7 and the p-side electrode 4 oppose each other.

In this specific example, the width of the region where the second film 4b contacts the p-type semiconductor layer 2 is narrower at the central portion than at the peripheral portion of the semiconductor light emitting device 101. Namely, the width b0 of the region where the second film 4b contacts the p-type semiconductor layer 2 at the central portion of the semiconductor light emitting device 101 is narrower than the width a0 of the region where the second film 4b contacts the p-type semiconductor layer 2 at the peripheral portion of the semiconductor light emitting device 101.

In the case where light emitted in a flip-chip semiconductor light emitting device is extracted to the exterior as in the semiconductor light emitting device 101 according to this embodiment, the light extraction efficiency is better as the light emitting region is more proximal to the central portion of the semiconductor light emitting device.

In the case where, for example, semiconductor light emitting devices fabricated on a sapphire substrate or a gallium nitride substrate are separated into square or rectangular devices, two or all four sides of the device are not cleavage faces. Therefore, the reproducibility of the device end face configuration is poor due to breaking when separating into devices.

In the semiconductor light emitting device 101 according to this embodiment, the first film 4a having good ohmic connection characteristics can be disposed as proximal as possible to the central portion. Therefore, the light extraction efficiency improves. The light emitting region can be as proximal as possible to the central portion of the semiconductor light emitting device 101. Therefore, effects of the device end face can be suppressed, and the light output reproducibility improves.

The reflecting region can be formed of the first film 4a having good ohmic connection characteristics and the second film 4b having non-ohmic connection characteristics, and the reflecting region is large.

Thus, according to the semiconductor light emitting device 101, the reflecting region can be formed in a larger area while controlling the light emitting region to be disposed in the central portion of the semiconductor light emitting device 101, providing high light extraction efficiency. Therefore, light extraction efficiency and light output reproducibility can be improved.

The first film 4a of the semiconductor light emitting device 101 may include silver or silver alloy. Thereby, the first film 4a has better ohmic connection characteristics with respect to the p-type semiconductor layer 2 and a lower contact resistance with the p-type semiconductor layer 2.

The second film 4b may include Al or Al alloy. Thereby, the second film 4b may have non-ohmic connection characteristics with respect to the p-type semiconductor layer 2 and a relatively high contact resistance with the p-type semiconductor layer 2.

The semiconductor light emitting device 101 according to this embodiment may be formed of, for example, a nitride semiconductor formed on the substrate 10 made of sapphire.

Namely, for example, metal organic chemical vapor deposition may be used to form, on the substrate 10 having a surface made of a sapphire c-plane, a sequentially stacked structure including a high carbon-concentration first AlN buffer layer (having a carbon concentration of $3\times10^{18}$ cm$^{-3}$ to $5\times10^{20}$ cm$^{-3}$) with a thickness of 3 nm to 20 nm, a high-purity second AlN buffer layer (having a carbon concentration of $1\times10^{16}$ cm$^{-3}$ to $3\times10^{18}$ cm$^{-3}$) with a thickness of 2 μm, a non-doped GaN buffer layer with a thickness of 3 μm, a Si-doped n-type GaN contact layer (having a Si concentration of $1\times10^{18}$ cm$^{-3}$ to $5\times10^{18}$ cm$^{-3}$) with a thickness of 4 μm, a Si-doped n-type $Al_{0.10}Ga_{0.90}N$ cladding layer (having a Si concentration of $1\times10^{18}$ cm$^{-3}$) with a thickness of 0.02 μm, a light emitting layer having a multiple quantum well structure of three alternately stacked periods of a Si-doped n-type $Al_{0.11}Ga_{0.89}N$ barrier layer (having a Si concentration of $1.1\times10^{19}$ to $2.0\times10^{19}$ cm$^{-3}$) and a GaInN light emitting layer (having a wavelength of 380 nm) with a thickness 0.075 μm, a first final $Al_{0.11}Ga_{0.89}N$ barrier layer of a multiple quantum well (having a Si concentration of $1.1\times10^{19}$ to $2.0\times10^{19}$ cm$^{-3}$) with a thickness 0.01 μm, a second final Si-doped n-type $Al_{0.11}Ga_{0.89}N$ barrier layer of a multiple quantum well (having a Si concentration of $0.8\times10^{19}$ to $1.0\times10^{19}$ cm$^{-3}$) with a thickness of 0.01 μm, a non-doped $Al_{0.11}Ga_{0.89}N$ spacer layer with a thickness of 0.02 μm, a Mg-doped p-type $Al_{0.28}Ga_{0.72}N$ cladding layer (having a Mg concentration of $1\times10^{19}$ cm$^{-3}$) with a thickness of 0.02 μm, a Mg-doped p-type GaN contact layer (having a Mg concentration of $1\times10^{19}$ cm$^{-3}$) with a thickness of 0.1 μm, and a high-concentration Mg-doped p-type GaN contact layer (having a Mg concentration of $2\times10^{20}$ cm$^{-3}$) with a thickness of 0.02 μm.

Here, the n-type semiconductor layer 1 illustrated in FIG. 1A corresponds to the Si-doped n-type GaN contact layer recited above. The n-type semiconductor layer 1 may further include the high carbon-concentration first AlN buffer layer, the high-purity second AlN buffer layer, the Si-doped n-type GaN contact layer, and the Si-doped n-type $Al_{0.1}Ga_{0.90}N$ cladding layer recited above.

The light emitting layer 3 illustrated in FIG. 1A may include the light emitting layer having the multiple quantum well structure formed of three alternately stacked periods of the Si-doped n-type $Al_{0.11}Ga_{0.89}N$ barrier layer and the GaInN light emitting layer (having a wavelength of 380 nm) recited above. The light emitting layer 3 may further include the first final $Al_{0.11}Ga_{0.89}N$ barrier layer and the second final Si-doped n-type $Al_{0.11}Ga_{0.89}N$ barrier layer.

The p-type semiconductor layer 2 illustrated in FIG. 1A corresponds to the Mg-doped p-type GaN contact layer recited above. The p-type semiconductor layer 2 may further include the Mg-doped p-type $Al_{0.28}Ga_{0.72}N$ cladding layer and the high concentration Mg-doped p-type GaN contact layer recited above.

The stacked structure unit 1s includes the substrate 10 made of sapphire on a second major surface 1b side opposite the first major surface 1a.

The formation of the electrodes on the semiconductor layers will now be described.

As illustrated in FIGS. 1A and 1B, dry etching is performed using a mask to remove the p-type semiconductor layer 2 and the light emitting layer 3 from a region of a portion of the semiconductor layers until the n-type contact layer is exposed at the surface. A thermal CVD (Chemical Vapor Deposition) apparatus is used to form a not-illustrated $SiO_2$ film having a thickness of 400 nm on the entire semiconductor layers including the exposed n-type semiconductor layer 1.

To form the p-side electrode 4, first, a not-illustrated patterned lift-off resist is formed on the semiconductor layers, and the $SiO_2$ film on the p-type contact layer is removed by ammonium hydrogen fluoride treatment. A vacuum vapor deposition apparatus, for example, is used to form a Ag film forming the first film 4a with a film thickness of 200 nm in the region where the $SiO_2$ film was removed. Sintering is performed at 350° C. in a nitrogen atmosphere for one minute.

Similarly, a patterned lift-off resist is formed with openings on the end of the region where the Ag film is formed and the p-type contact layer where the Ag film is not formed; the $SiO_2$ film on the p-type contact layer is removed by ammonium hydrogen fluoride treatment; and an Al/Ni/Au film, for example, is formed with a film thickness of 300 nm as the second film 4b. Al functions as a high-efficiency reflecting film. Au performs the role of protecting the high-efficiency reflecting film from deterioration due to native oxidation, chemical processing, etc. Ni is disposed between Al and Au to improve adhesion and prevent alloying.

To form the n-side electrode 7, a not-illustrated patterned lift-off resist is formed on the semiconductor layers, and the $SiO_2$ film on the exposed n-type contact layer is removed by ammonium hydrogen fluoride treatment. The n-side electrode 7 made of, for example, Ti/Pt/Au is formed with a film thickness of 500 nm in the region where the $SiO_2$ film was removed.

Then, back grinding is performed; cleavage or cutting using a diamond blade, etc., is performed; individual LED devices having, for example, a width of 400 µm and a thickness of 100 µm are fabricated; and the semiconductor light emitting device 101 according to this embodiment is fabricated.

Figure 2A:
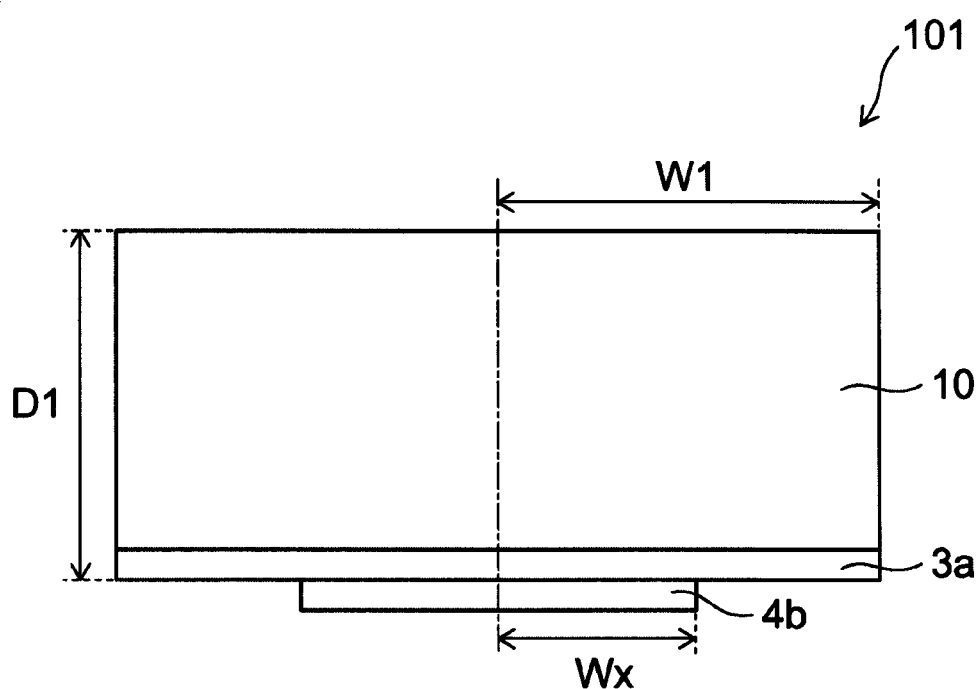
FIGS. 2A and 2B are schematic views illustrating characteristics of the semiconductor light emitting device according to the first embodiment of the invention.
Figure 2B:
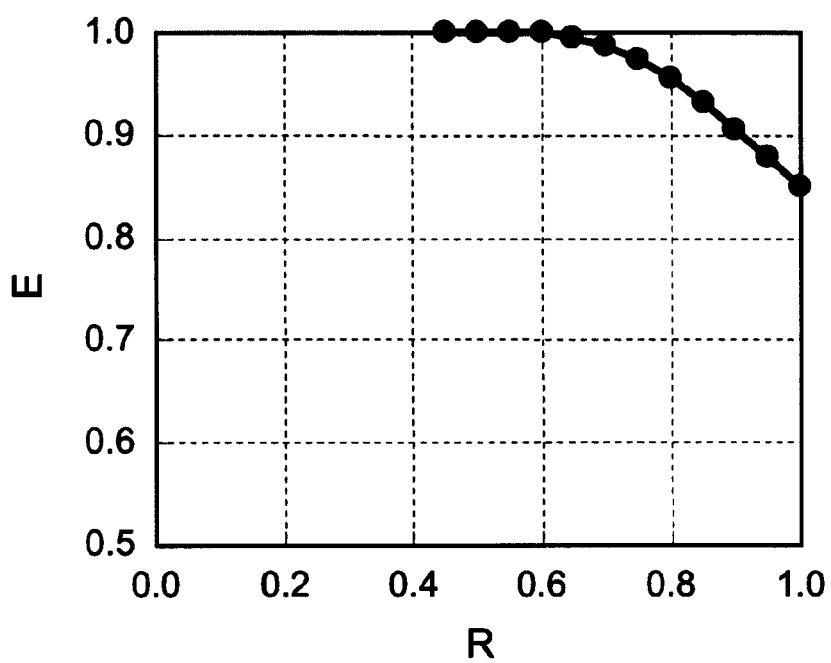

FIGS. 2A and 2B are schematic views illustrating characteristics of the semiconductor light emitting device according to the first embodiment of the invention.

Namely, FIGS. 2A and 2B illustrate results of simulations by ray tracing of the relationship between the light extraction efficiency and the ratio of the device width to the current injection region width of the semiconductor light emitting device.

FIG. 2A is a schematic cross-sectional view illustrating the configuration of the semiconductor light emitting device used in the ray tracing simulation. FIG. 2B illustrates the simulation results. A ratio R of a current injection region width Wx to a device width W1 of the semiconductor light emitting device (i.e., Wx/W1) is plotted on the horizontal axis. A light extraction efficiency E is plotted on the vertical axis. FIG. 2A shows a simplified illustration of the semiconductor layers as a semiconductor layer 3a including the light emitting layer 3.

The structure of the semiconductor light emitting device 101 of this simulation illustrated in FIG. 2A is horizontally symmetric. Therefore, the device width W1 and the current injection region width Wx recited above were assumed to be one-half of the actual widths, respectively. The substrate 10 was assumed to be sapphire, and the current injection region (the first film 4a) was assumed to be a Ag film.

For the semiconductor light emitting device of this ray tracing simulation, the width W1 was assumed to be 400 µm, and a thickness D1 was assumed to be 100 µm. The simulation of light extraction efficiency of the semiconductor light emitting device was performed by changing the width Wx of the first film 4a as the current injection region.

Here, the center of the current injection region (the first film 4a) was assumed to constantly be the center of the semiconductor light emitting device. Light was assumed to be emitted by the light emitting layer of the semiconductor layer 3a directly below the current injection region (the first film 4a).

Only the light extracted to the exterior of the semiconductor light emitting device without reflection was included in the calculation of the light extraction efficiency.

As illustrated in FIG. 2B, the light extraction efficiency increases as the ratio R of the current injection region width Wx to the device width W1 decreases, that is, as the width of the first film 4a becomes relatively small with respect to the device width W1. A similar trend is seen in the case where reflections are considered.

Now, ray paths are considered for a two-dimensional semiconductor light emitting device model having an aspect ratio of the device width W1 to the thickness D1 of four, in which light is emitted at angles that undergo total internal reflection at the surface of the substrate 10 and are transmitted at the side faces of the substrate 10.

Light emitted at the center of the semiconductor light emitting device travels from the light emitting layer toward the substrate surface, undergoes total internal reflection at the substrate surface, and then reaches the substrate side face with almost no absorption.

Conversely, in the case where light is emitted proximal to the side face of the semiconductor light emitting device, the component of light incident on the proximal substrate side face reaches the substrate side face with almost no absorption, while the component travelling in the opposite direction reaches the substrate side face after repeatedly being reflected by the substrate surface and/or the electrode formation surface. In the case of the latter, the light output attenuates due to light reflected by the reflecting electrode having a reflectance lower than that of the total internal reflection and light repeatedly passing through the semiconductor layers having defects, i.e., absorbing bodies. Therefore, the light extraction efficiency of the latter is lower than that of the former. In the case of ultraviolet light for which the reflectance of metal is generally low, this difference is even more pronounced.

As described above, the light extraction efficiency is higher as the light emitting region is more proximal to the central portion of the device, that is, as light is emitted proximal to the center of the device.

However, the contact resistance with the p-type contact layer increases and the operating voltage increases as the surface area of the first film 4a is reduced.

The surface area and the disposition in the device of the first film 4a may be appropriately decided by considering such effects.

For example, when designing the first film 4a of the semiconductor light emitting device 101 of this specific example illustrated in FIGS. 1A and 1B, it is better to form the first film 4a as proximal as possible to the end of the p-type contact layer at the central portion of the semiconductor light emitting device 101, that is, the region where the first film 4a and the n-side electrode 7 oppose each other, considering process conditions such as lithography precision and the design of the second film 4b.

At the peripheral portion of the semiconductor light emitting device 101, that is, the three sides not opposing the n-side electrode 7, it is better that the first film 4a is formed in a region somewhat distal to the end of the p-type contact layer considering the tradeoffs recited above.

In other words, it is desirable that the width of the second film 4b contacting the p-type contact layer (i.e., the p-type semiconductor layer 2) is narrower at the central portion than at the peripheral portion.

Thus, by setting the distance from the outer edge of the second film 4b to the first film 4a to be shorter at the central portion (the width b0) than at the peripheral portion (the width a0, the width a1, and the width a2) of the semiconductor light emitting device 101, the first film 4a having good ohmic connection characteristics can be disposed in the central portion of the semiconductor light emitting device 101.

By making the width b0 of the region where the second film 4b contacts the p-type semiconductor layer 2 at the central portion narrower than the width a0 (including the width a1 and the width a2) of the region where the second film 4b contacts the p-type semiconductor layer 2 at the peripheral portion of the semiconductor light emitting device 101, the first film 4a having good ohmic connection characteristics can be disposed at the central portion of the semiconductor light emitting device 101.

Thus, the light emitting region can be disposed in the central portion of the semiconductor light emitting device 101.

In other words, current is restricted to the first film 4a portion, and the reflecting region is enlarged while disposing the light emitting region in the central portion.

In such a case, it is possible that the semiconductor layers around the difference in levels on either side of the light emitting layer 3 may be damaged due to, for example, the dry etching that exposes the n-type contact layer at the surface. Injecting current into a damaged light emitting layer may not only cause poor efficiency but also may affect the reliability of the device.

In the semiconductor light emitting device 101 according to this embodiment, the current injection region (the first film 4a) can be distal to the difference in levels on either side of the light emitting layer. Therefore, current can be injected efficiently only to the undamaged light emitting layer 3, and the light output and the reliability can be improved.

One efficiency representing a characteristic of a semiconductor light emitting diode is external quantum efficiency, expressed as the proportion of the number of photons radiated to the exterior of the semiconductor light emitting diode to the number of electrons injected into the light emitting layer of the semiconductor light emitting diode. The external quantum efficiency is represented by the product of the internal quantum efficiency of the LED chip and the light extraction efficiency.

This embodiment includes technology to increase this light extraction efficiency.

In the case of a semiconductor light emitting diode emitting blue light, the current dependency of the external quantum efficiency of a 400 µm by 400 µm semiconductor light emitting diode used at an operating current of about 20 mA normally exhibits a maximum at a low current value of about 10 mA. The current dependency rapidly decreases as the current value increases above the maximum value. Conversely, in the case of a semiconductor light emitting diode emitting ultraviolet light at 400 nm and below, the external quantum efficiency has a maximum in a region at or above the operating current and gradually decreases thereafter.

As in this embodiment, reducing the surface area of the first film 4a having good ohmic connection characteristics causes the current at which the maximum value of the external quantum efficiency is obtained to decrease. In such a case where a blue light emitting device is used, this effect is huge, and it is conceivable that the decrease of the external quantum efficiency is greater than the light extraction efficiency improved by the structure of this embodiment. However, the external quantum efficiency rather increases in the case of an ultraviolet light emitting device, and the external quantum efficiency drastically improves in addition to the light extraction efficiency improvement of this embodiment.

Thus, the semiconductor light emitting device 101 according to this embodiment provides high light extraction efficiency and high light output reproducibility.

First Comparative Example

Figure 3A:
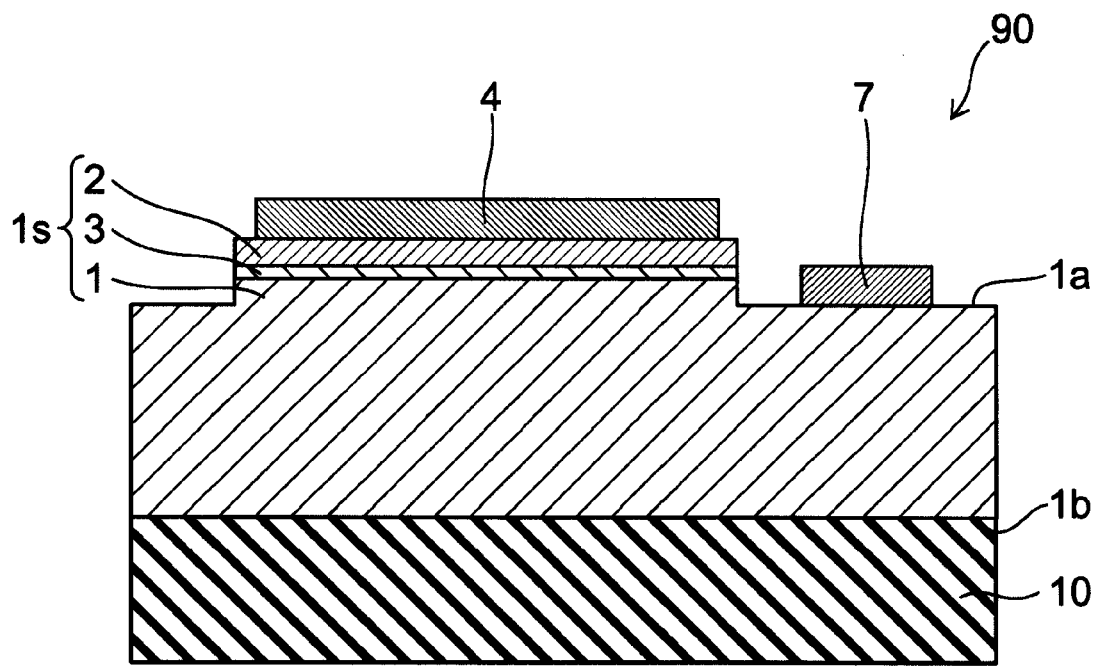
FIGS. 3A and 3B are schematic views illustrating the configuration of a semiconductor light emitting device of a first comparative example.
Figure 3B:
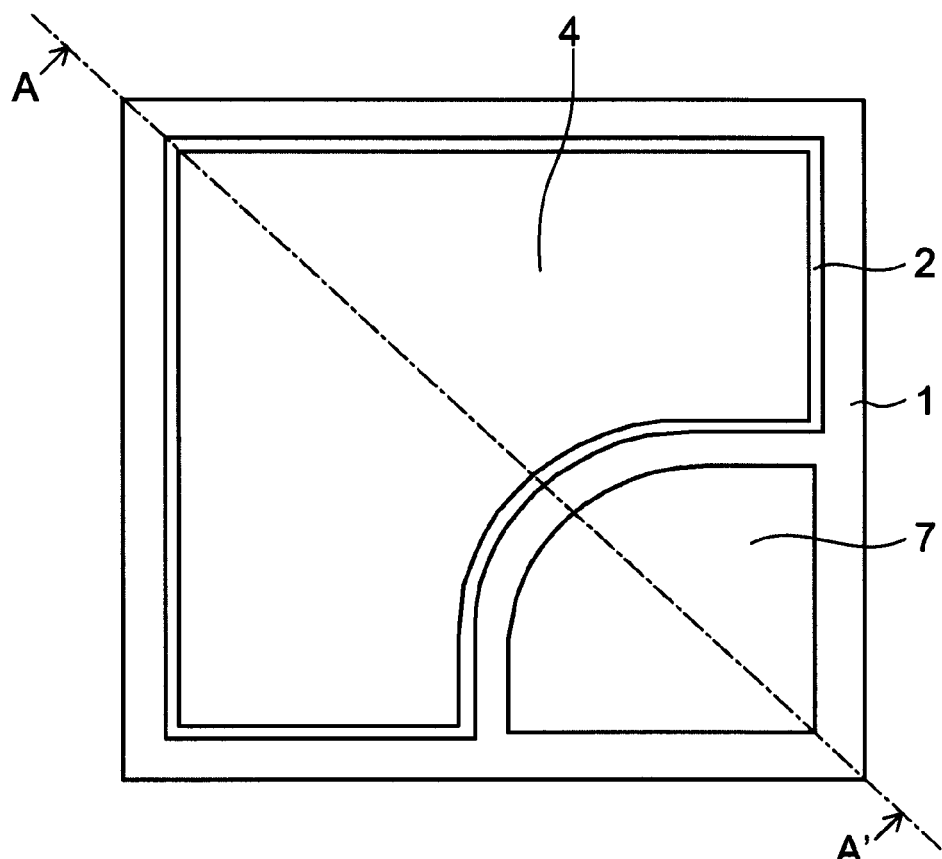

FIGS. 3A and 3B are schematic views illustrating the configuration of a semiconductor light emitting device of a first comparative example.

Namely, FIG. 3B is a plan view, and FIG. 3A is a cross-sectional view along line A-A' of FIG. 3B.

The entire p-side electrode 4 of a semiconductor light emitting device 90 of the comparative example illustrated in FIGS. 3A and 3B is formed of a reflecting electrode made of Ag having good ohmic connection characteristics with respect to the p-type contact layer (the p-type semiconductor layer 2).

The semiconductor light emitting device 90 of the comparative example having such a configuration is fabricated as described below.

To form the p-side electrode 4, a patterned lift-off resist is formed on the semiconductor layers, and the $SiO_2$ film on the p-type contact layer is removed by ammonium hydrogen fluoride treatment. A vacuum vapor deposition apparatus is used to form Ag with a film thickness of 200 nm as a reflecting electrode in the region where the $SiO_2$ film was removed. After lift-off, sintering is performed at 350° C. in a nitrogen atmosphere for one minute.

To form the n-side electrode 7, a patterned lift-off resist is formed on the semiconductor layers, and the $SiO_2$ film on the n-type contact layer is removed by ammonium hydrogen fluoride treatment. Ti/Pt/Au forming the n-side electrode is formed with a film thickness of 500 nm.

A tradeoff occurs in this comparative example between securing the reflecting region and providing a light emitting region optimal for light extraction efficiency and light output reproducibility. Therefore, electrode design for optimal light output characteristics is not always possible, the light extraction efficiency is low, and the light output reproducibility is poor. In other words, the configuration does not enable optimal electrode design because the entire reflecting region is formed of the reflecting electrode having good ohmic connection characteristics with respect to the p-type contact layer.

Therefore, the light extraction efficiency is low and the light output reproducibility is low.

Second Comparative Example

Figure 4A:
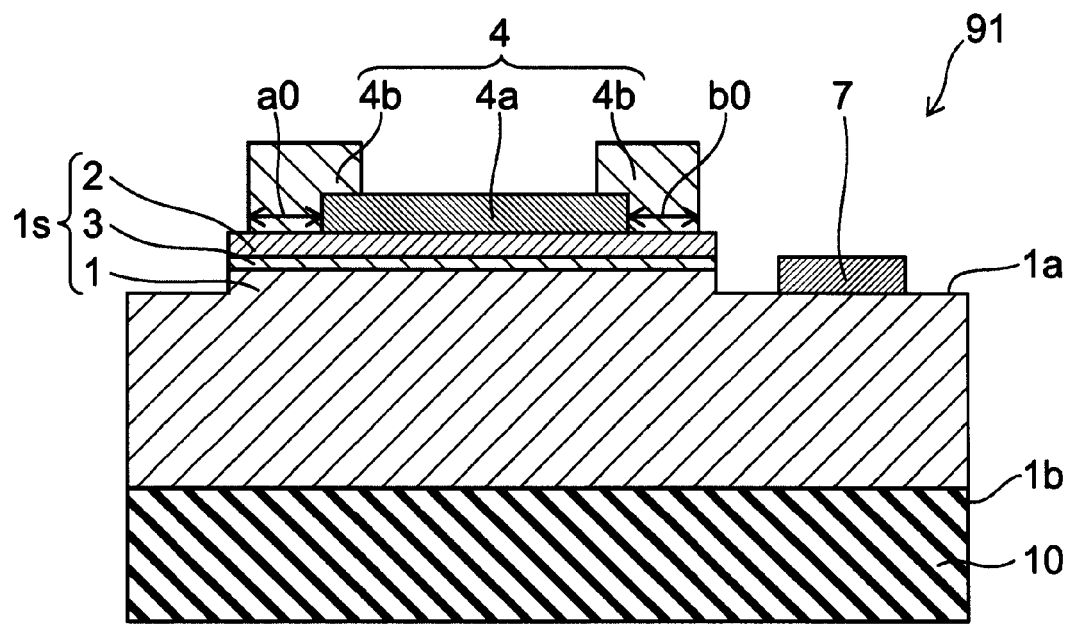
FIGS. 4A and 4B are schematic views illustrating the configuration of a semiconductor light emitting device of a second comparative example.
Figure 4B:
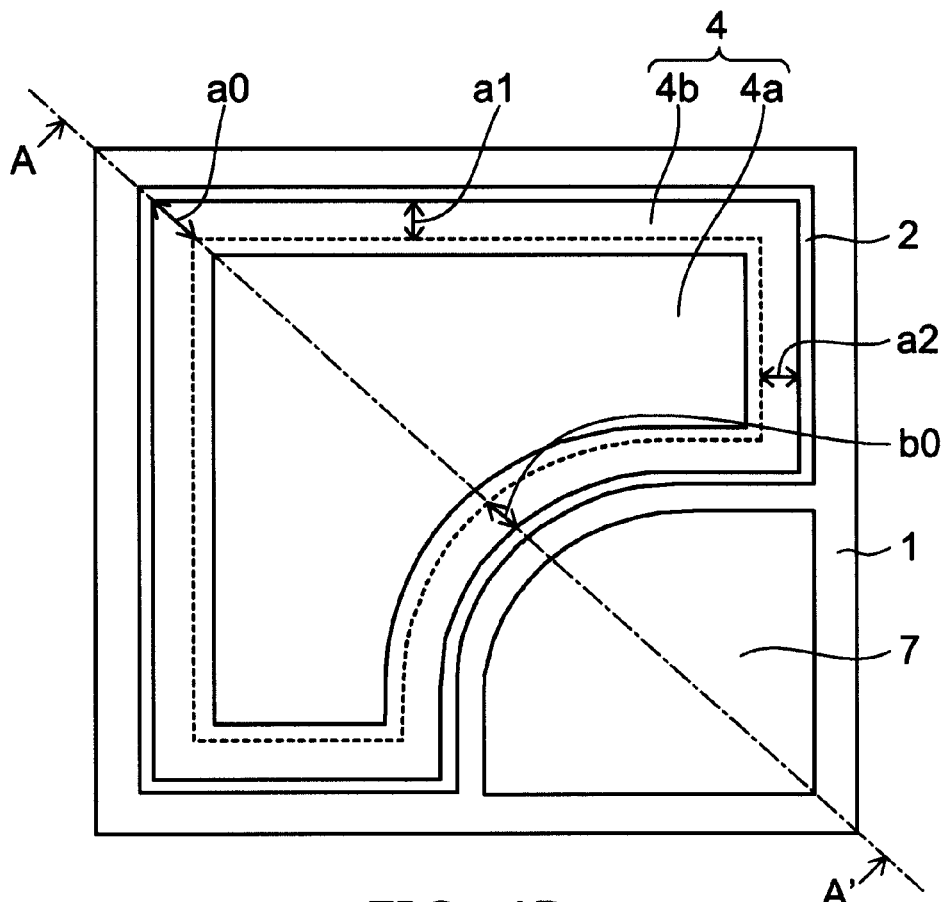

FIGS. 4A and 4B are schematic views illustrating the configuration of a semiconductor light emitting device of a second comparative example.

Namely, FIG. 4B is a plan view, and FIG. 4A is a cross-sectional view along line A-A' of FIG. 4B.

Similarly to the p-side electrode 4 of the semiconductor light emitting device 101 according to this embodiment, the p-side electrode 4 of a semiconductor light emitting device 91 of the second comparative example illustrated in FIGS. 4A and 4B includes the first film 4a having good ohmic connection characteristics and the second film 4b having non-ohmic connection characteristics. The second film 4b is provided on the p-type semiconductor layer 2 to contact an edge portion of the first film 4a. However, in the case of the semiconductor light emitting device 91 of the second comparative example, the distance from the outer edge of the second film 4b to the first film 4a is the same at the central portion and the peripheral portion of the semiconductor light emitting device 91.

In other words, in the case of the semiconductor light emitting device 91 of the second comparative example, the distance from the outer edge of the second film 4b to the first film 4a at the peripheral portion of the semiconductor light emitting device 91, that is, the width a0 on the diagonal line, is the same as the distance from the outer edge of the second film 4b to the first film 4a at the central portion of the semiconductor light emitting device 91, that is, the width b0. In such a case, the width b0 is larger than the width a1 and the width a2.

Therefore, in the semiconductor light emitting device 91 of the second comparative example, the first film 4a having good ohmic characteristics is not disposed in the optimal portion of the central portion of the semiconductor light emitting device 91. Restated, the first film 4a is disposed further toward the outside of the device than the first film 4a of the semiconductor light emitting device 101 according to this embodiment. Therefore, the light emitting region is shifted from the central portion of the device, the light extraction efficiency is low, and the light output reproducibility is low.

Conversely, as described above, the p-side electrode 4 of the semiconductor light emitting device 101 according to this embodiment is formed of the first film 4a having good ohmic connection characteristics and the second film 4b having non-ohmic connection characteristics. The distance from the outer edge of the second film 4b to the first film 4a is set shorter at the central portion than at the peripheral portion of the semiconductor light emitting device. That is, the width of the region where the second film 4b contacts the p-type semiconductor layer 2 is narrower at the central portion than at the peripheral portion of the semiconductor light emitting device 101. Thereby, the first film 4a is disposed in the central portion of the device. Thereby, current is restricted to the first film 4a portion, and the surface area of the entire reflecting region can be enlarged while disposing the light emitting region in the central portion. Thereby, a semiconductor light emitting device is provided having a high light extraction efficiency and high light output reproducibility.

Although the width b0 of the central portion is narrower than the width a0, the width a1, and the width a2 of the peripheral portion of the semiconductor light emitting device 101 according to this embodiment illustrated in FIGS. 1A and 1B, the invention is not limited thereto. The width b0 of the central portion may be narrower than the width a0 of the peripheral portion and equal to or wider than the width a1 and the width a2 of the peripheral portion. Also in such a case, the first film 4a can be disposed proximal to the center of the semiconductor light emitting device 101, and a semiconductor light emitting device is thereby provided having a high light extraction efficiency and high light output reproducibility.

In the case where Ag is used as the first film 4a and Al is used as the second film 4b in the semiconductor light emitting device 101 according to this embodiment, not only is the current restricted to the first film 4a and the high-efficiency reflecting region increased, but also the first film 4a is covered by Al which has better adhesion than noble metal and a linear coefficient of thermal expansion near that of Ag. Therefore, the second film 4b can function as a good passivation film for the first film 4a and relieve thermal stress acting on the first film 4a during operation.

Further, slight diffusion of Al into the end of the first film 4a made of Ag can increase the contact resistance in this region and relieve current concentration in the end of the first film 4a made of Ag.

Furthermore, the interface between Al and the p-type GaN contact layer exhibits non-ohmic connection characteristics. Therefore, a structure can be made in which the current density gradually decreases from the first film 4a to the second film 4b, thereby relieving current concentration in this region.

Increasing the Mg concentration of the Mg-doped p-type GaN contact layer in the semiconductor light emitting device 101 according to this embodiment to about $1\times10^{20}$ cm$^{-3}$ improves the ohmic contact characteristics with the p-side electrode 4. However, a semiconductor light emitting diode differs from a semiconductor laser diode in that there is a risk of deterioration of characteristics due to Mg diffusion due to the short distance between the contact layer and the light emitting layer 3. Therefore, by utilizing the increased contact surface area between the p-side electrode 4 and the contact layer and the lower current density during operation, the Mg concentration can be kept at about $1\times10^{19}$ cm$^{-3}$ without greatly harming the electrical characteristics. Thereby, Mg diffusion can be prevented, and light emission characteristics can be improved.

The high carbon-concentration first AlN buffer layer acts to relieve effects due to differences of crystal types with the substrate and particularly reduce screw dislocations.

The surface of the high-purity second AlN buffer layer flattens at the atomic level. Although defects of the non-doped GaN buffer layer grown thereon can be thereby reduced, to this end, it is favorable that the film thickness of the high-purity second AlN buffer layer is thicker than 1 μm. To prevent warp due to strain, it is desirable that the thickness of the high-purity second AlN buffer layer is not greater than 4 μm. The high-purity second AlN buffer layer is not limited to AlN, $Al_xGa_{1-x}N$ ($0.8 \leq x \leq 1$) may be used, and the warp of the wafer can be compensated.

The non-doped GaN buffer layer performs the role of reducing defects by performing three-dimensional island growth on the high-purity second AlN buffer layer. It is necessary for the average film thickness of the non-doped GaN buffer layer to be not less than 2 μm to allow flattening of the growth surface. A total film thickness of the non-doped GaN buffer layer of 4 to 10 μm is appropriate from the aspect of reproducibility and reduction of warp.

By using such buffer layers, defects can be reduced to about one-tenth of those of conventional low-temperature growth AlN buffer layers. Such technology enables high-concentration Si doping of the n-type GaN contact layer and the manufacture of highly efficient semiconductor light emitting devices emitting light even in the ultraviolet band.

Although high concentration Si-doping of the barrier layer of the multiple quantum well improves the luminous efficacy of the light emitting layer, the crystal quality of the barrier layer deteriorates. The deterioration of the crystal quality causes holes sensitive to defects to inactivate prior to reaching the light emitting layer, and the injection efficiency of holes into the light emitting layer decreases. As a result, the luminous efficacy of the semiconductor light emitting device decreases. In the case where Mg diffuses into a barrier layer doped with Si to the doping limit, the barrier layer rapidly deteriorates, further accelerating the diffusion of Mg.

During operation, the hole concentration in the final barrier layer injected from the p-type semiconductor layer 2 has a concentration higher on the p-type semiconductor layer 2 side than the n-type semiconductor layer 1 side. Therefore, improving the quality on the p-type semiconductor layer 2 side is the key to increasing the hole injection efficiency.

In this specific example, the hole injection efficiency is maintained, the luminous efficacy of the light emitting layer 3 can be improved, and as a result, the luminous efficacy of the semiconductor light emitting device can be improved by using a two-layer structure in which the final barrier layers of multiple quantum wells include the first final barrier layer having a high concentration Si-doping similar to that of the barrier layers in the quantum wells and the second final barrier layer having a Si-doping concentration lower than that of the first final barrier layer, setting the high concentration on the well layer side, and setting the low concentration on the p-type semiconductor layer 2 side.

By using the buffer layers recited above, it is possible to form high-quality GaN on the sapphire substrate, and crystal growth is possible using a high growth temperature and a high group V/group III ratio which is normally difficult to use due to irregular growth. Therefore, the occurrence of point defects can be suppressed, a higher Si-doping of the barrier layer is possible, and the luminous efficacy of the semiconductor light emitting device can therefore be improved more.

The semiconductor light emitting device 101 according to this embodiment is made of at least the semiconductor layers including the n-type semiconductor layer, the p-type semiconductor layer, and the light emitting layer disposed therebetween. Although the materials of the semiconductor layers are not particularly limited, a gallium nitride compound semiconductor such as, for example, $Al_xGa_{1-x-y}In_yN$ ($x \geq 0$, $y \geq 0$, and $x+y \leq 1$) may be used. Although the methods for forming such semiconductor layers are not particularly limited, technology such as, for example, metal organic chemical vapor deposition, molecular beam epitaxy, and the like may be used. Although the substrate material of the semiconductor light emitting device 101 according to this embodiment is not particularly limited, general substrates such as sapphire, SiC, GaN, GaAs, and Si may be used. The substrate may ultimately be removed.

In the case of a semiconductor light emitting device using a sapphire substrate, the refractive indexes differ greatly between the substrate and the semiconductor layers. Therefore, the majority of the emitted light is reflected at the interface and is easily confined in the interior of the semiconductor layers. In the general case of nitride semiconductor layers on a sapphire substrate, the many defects existing in the semiconductor layers, the amorphous or polycrystalline low-temperature growth buffer layers, and the like form absorbing bodies, and the effects of increasing the high-efficiency reflecting region are relatively limited because light is undesirably absorbed without being repeatedly reflected in the interior of the semiconductor layers.

Conversely, monocrystalline AlN buffer layers are used in the semiconductor light emitting device 101 according to this embodiment. Thereby, absorption does not easily occur in the buffer layers, the defects in the semiconductor layers are dramatically reduced, the factors causing light absorption in the semiconductor layers can be reduced as much as possible, and the emitted light is repeatedly reflected over and over again in the semiconductor layers. Therefore, the effects of increasing the high-efficiency reflecting region are higher.

The first film 4a may be formed of a metal film including at least silver or silver alloy on the side facing the p-type contact layer. The material of the metal film of the first film 4a may be a single layer of silver or may be alloy layers including metal other than silver.

Although there is a trend for the reflection efficiencies of normal metal single-layer films for the visible light band to decrease as the wavelengths become shorter in the ultraviolet band of 400 nm and below, silver has high reflecting efficiency characteristics for light in the ultraviolet band of 370 nm to 400 nm. Therefore, in the case where the semiconductor light emitting device emits ultraviolet light and the metal film of the first film 4a is silver alloy, it is desirable that the component ratio of silver of the metal film on the side facing the p-type contact layer is high.

It is favorable that the film thickness of the first film 4a is not less than 100 nm to ensure the light reflection efficiency. On the other hand, the second film 4b is formed of a metal film including at least aluminum or aluminum alloy on the side facing the p-type contact layer and electrically contacts the first film 4a.

Although there is a trend for the reflection efficiencies of normal metal single-layer films for the visible light band to decrease as the wavelengths become shorter in the ultraviolet band of 400 nm and below, aluminum has high reflecting efficiency characteristics for light in the ultraviolet band of 370 nm to 400 nm. Therefore, in the case where the semiconductor light emitting device emits ultraviolet light and the metal film of the second film 4b is aluminum alloy, it is desirable that the component ratio of aluminum of the metal film on the side facing the p-type contact layer is high.

Heat treatment may be performed after forming the second film 4b. Heat treatment improves the adhesion of aluminum, heat dissipation, and reliability. Thereby, the semiconductor layers and the alloy can be made easily. Therefore, the contact resistance between the second film 4b and the p-type contact layer increases, and current may be provided more exclusively to the first film 4a region. It is favorable that the heat treatment temperature of the second film 4b is lower than the heat treatment temperature of the first film 4a and the n-side electrode 7.

It is favorable that the film thickness of the second film 4b is not less than 100 nm to ensure the light reflection efficiency.

Aluminum has a low work function and reacts (alloys) easily with nitride semiconductors. Therefore, aluminum has non-ohmic connection characteristics with respect to the p-type contact layer. Therefore, current can be restricted to the first film 4a during current injection, and the light emitting region can be realized as designed.

The inventors discovered from the results of many experiments that silver used in the first film 4a has poor adhesion and easily diffuses the metal formed thereupon to the p-type contact layer.

Utilizing such characteristics, aluminum can be diffused slightly into the end of the first film 4a. The contact resistance of this region can thereby be slightly increased, and current concentration at the end of the first film 4a can be relieved.

Aluminum and the p-type contact layer exhibit non-ohmic connection characteristics. Therefore, a structure can be made in which the current density gradually decreases from the first film 4a to the second film 4b, thereby relieving current concentration in this region.

The second film 4b may be covered by noble metal or high melting point metal to prevent separation and/or diffusion. Thereby, aluminum having better adhesion than noble metal and high melting point metal covers the end of the first film 4a to function as a structure having better separation prevention.

Aluminum has a linear coefficient of thermal expansion near that of silver. Therefore, thermal stress on the first film 4a during operation can be relieved.

High light output, high yield, and high reliability can be realized by these effects. By forming the second film 4b adjacent to the first film 4a made of silver or silver alloy, the first film 4a does not contact a dielectric film and is not easily exposed to ion impurities and moisture included in the dielectric film. Therefore, migration of silver is suppressed, and reliability improves.

A pad may be provided separately on the p-side electrode 4 for improving bondability of wire bonding, improving die shear strength when forming gold bumps using a ball bonder, for flip-chip mounting, etc. The film thickness of the pad is not particularly limited, and may be, for example, 100 nm to 1,000 nm.

On the other hand, the material of the n-side electrode 7 is not particularly limited and may be formed of a conductive single or multi-layer film usable as an ohmic electrode of the n-type semiconductor layer 1. The formation method also is not particularly limited. For example, a multilayered structure may be formed by electron beam vapor deposition, after which sintering is performed. In the case of sintering, it is favorable to separately provide a pad on the n-side electrode 7 to improve bondability.

Various modifications of the semiconductor light emitting device 101 according to this embodiment are possible.

First Modification

Although a Ag film having a thickness of 200 nm was used as the first film 4a in the semiconductor light emitting device 101, a stacked film made of Ag/Pt having a thickness of 200 nm is used as the first film 4a in a first modification.

By forming the Ag/Pt stacked film as the first film 4a and then performing sintering, a very small amount of Pt can be diffused into the interface between the p-GaN contact layer and the Ag. Thereby, the adhesion of the Ag improves and the contact resistance can be reduced without harming the high-efficiency reflecting characteristics which are characteristic of Ag. Therefore, it is possible to provide to a high degree both the high-efficiency reflecting characteristics and low operating voltage characteristics required of the p-side electrode 4.

Specifically, by using the Ag/Pt stacked film as the first film 4a, it is possible to lower the operating voltage by 0.3 V at 20 mA compared to the case where the single-layer film of Ag is used as the first film 4a and provide substantially the same light output as the case where the single-layer film of Ag is used as the first film 4a.

Ag and Pt form a solid solution. Therefore, Pt mixes with Ag to suppress migration of Ag. As a result, high reliability can be obtained even during high current injection.

In the case where the electrode (i.e., the first film 4a) has good ohmic contact characteristics and a low reflectance, the end of the first film 4a is made as distal as possible to the end of the p-side electrode 4 (the first film 4a and the second film 4b) and the surface area of the second film 4b is increased to prevent the undesirable absorption of emitted light by the reflecting electrode itself. In such a case where the first film 4a provides to a high degree both ohmic contact characteristics and high-efficiency reflecting characteristics, the absorption of light by the first film 4a can be reduced. Therefore, the surface area of the first film 4a can be increased. Thereby, the first film 4a can be made proximal to the n-side electrode 7, allowing light emission from a region proximal to the center of the device.

Second Modification

In a second modification of the semiconductor light emitting device 101 according to this embodiment, the devices are separated in a device separation process using a laser scriber apparatus.

Although a laser scriber apparatus is simple, has high throughput, separates devices with good reproducibility, and is expected to improve the suitability for mass production, the laser scribe mark formed on the device end face becomes a region that absorbs emitting light. Therefore, the light absorption at the device end face cannot be ignored, and the light extraction efficiency declines.

In this modification of the semiconductor light emitting device according to this embodiment, the first film 4a, i.e., the light emitting region, is distal to the end of the device and thereby is not easily affected by the device end face.

Thus, combining the semiconductor light emitting device according to this embodiment with the device separation method using the laser scriber apparatus can minimize losses due to light absorption at the device end face and further improve the light extraction efficiency while improving the suitability for mass production.

Third Modification

In a third modification of the semiconductor light emitting device 101 according to this embodiment, a Ag/Pt film is formed with a thickness of 200 nm as the n-side electrode 7. The electrodes of the semiconductor light emitting device of the third modification are fabricated as described below.

First, to form the first film 4a and the n-side electrode 7, a patterned lift-off resist is formed on the semiconductor layers, and the SiO$_2$ film on the p-type contact layer and the n-type contact layer is removed by ammonium hydrogen fluoride treatment. A vacuum vapor deposition apparatus is used to form Ag/Pt with a film thickness of 200 nm in the region where the SiO$_2$ film was removed, and sintering is performed at 650° C. in a nitrogen atmosphere for one minute.

Similarly, a patterned lift-off resist is formed to provide openings on the end of the region where the Ag/Pt is formed and on the p-type contact layer where the Ag/Pt is not formed. The SiO$_2$ film on the p-type contact layer is removed by ammonium hydrogen fluoride treatment, and Al/Ni/Au, for example, is formed with a film thickness of 300 nm as the second film 4b.

Using a crystal on a monocrystalline AlN buffer layer enables high concentration Si-doping of the n-type GaN contact layer, and the contact resistance with the n-side electrode 7 can be drastically reduced. Therefore, silver (Ag/Pt), which is a high-efficiency reflecting film conventionally having poor ohmic characteristics and high contact resistance, can be used as the n-side electrode 7.

By forming the n-side electrode 7 of the high-efficiency reflecting film, the majority of the first major surface 1a of the stacked structure unit 1s on which the electrodes are formed can have a reflecting structure, and almost all of the emitted light repeatedly reflected in the semiconductor layers can be reflected to the substrate side. Therefore, further improvement of the light extraction efficiency can be expected.

In some cases, the light emitting region (the ohmic region) is made distal to the n-side electrode 7 considering the light absorption by the n-side electrode 7. In such a case, by forming the n-side electrode 7 with a high-efficiency reflecting structure, it is unnecessary to consider effects of light absorption by the n-side electrode 7, and the light emitting region (i.e., the region corresponding to the first film 4a) can be made proximal to the n-side electrode 7. By such effects, the light extraction efficiency improvement effects of the structure of the semiconductor light emitting device according to this embodiment can be utilized to the fullest.

Second Embodiment

Figure 5:
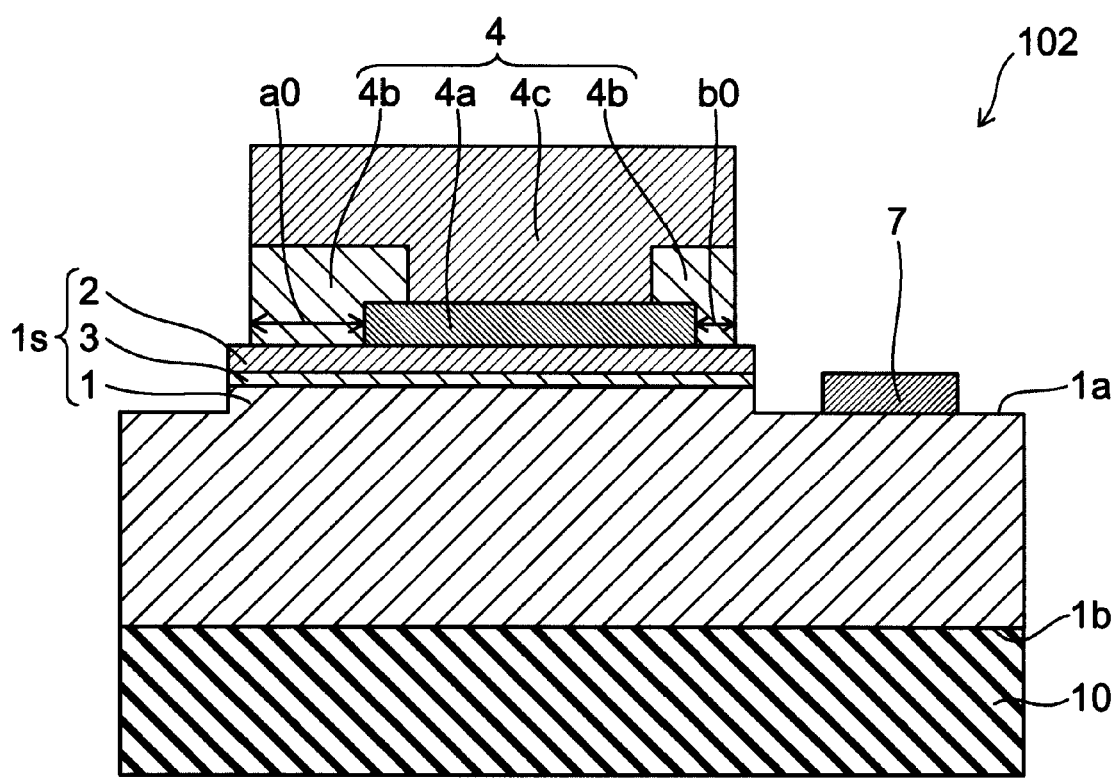
FIG. 5 is a schematic cross-sectional view illustrating the configuration of a semiconductor light emitting device according to a second embodiment of the invention.

FIG. 5 is a schematic cross-sectional view illustrating the configuration of a semiconductor light emitting device according to a second embodiment of the invention.

In a semiconductor light emitting device 102 according to the second embodiment of the invention illustrated in FIG. 5, the p-side electrode 4 further includes a third film 4c provided to cover at least a portion of the first film 4a exposed from the second film 4b and at least a portion of the second film 4b. The third film 4c is made of, for example, metal. Otherwise, the semiconductor light emitting device 102 may be similar to the semiconductor light emitting device 101 according to the first embodiment, and a description is omitted.

In this case as well, the distance from the outer edge of the second film 4b to the first film 4a is shorter at the central portion than at the peripheral portion of the semiconductor light emitting device.

The distance from the outer edge of the second film 4b to the first film 4a is longer at the portion other than the portion where the n-side electrode 7 and the p-side electrode 4 oppose each other, that is, for example, the peripheral portion of the semiconductor light emitting device 102, than at the portion where the n-side electrode 7 and the p-side electrode 4 oppose each other.

The width of the region where the second film 4b contacts the p-type semiconductor layer 2 is narrower at the central portion than at the peripheral portion of the semiconductor light emitting device 102.

In the semiconductor light emitting device 102 according to this embodiment, the third film 4c covers the first film 4a exposed from the second film 4b and at least a portion of the second film 4b, thereby preventing, for example, silver used in the first film 4a from being exposed to ambient air.

Because the majority of the first film 4a region contacts the third film 4c, the current path through the second film 4b can be reduced as much as possible, and deterioration due to electromigration of, for example, aluminum used in the second film 4b can be prevented. High reliability can be realized by such effects.

After forming the first film 4a and the second film 4b, the third film 4c can be formed by, for example, forming a patterned lift-off resist, forming, for example, a Pt/Au film with a thickness of 500 nm as the third film 4c to cover the first film 4a (e.g., silver) exposed from the second film 4b and at least a portion of the second film 4b (e.g., Al), and then removing the resist.

Metal not including silver may be used as the third film 4c recited above. The third film 4c electrically contacts the first film 4a and the second film 4b.

The material of the third film 4c is not particularly limited and may be a metal single or multi-layer film, a metal alloy layer, a single or multi-layer film of a conductive oxide film, or a combination thereof.

The film thickness of the third film 4c is not particularly limited and may be, for example, 100 nm to 1,000 nm.

Thus, as a minimum, exposure of the first film 4a (e.g., Ag) to ambient air is prevented and deterioration of the first film 4a (e.g., Ag) is prevented by covering the region of the first film 4a not covered by the second film 4b with the third film 4c. Electromigration of the second film 4b (e.g., Al) is prevented because almost no current flows in the second film 4b (e.g., Al). Thus, the semiconductor light emitting device 102 according to this embodiment provides high light extraction efficiency, high light output reproducibility, and high reliability.

Third Embodiment

Figure 6:
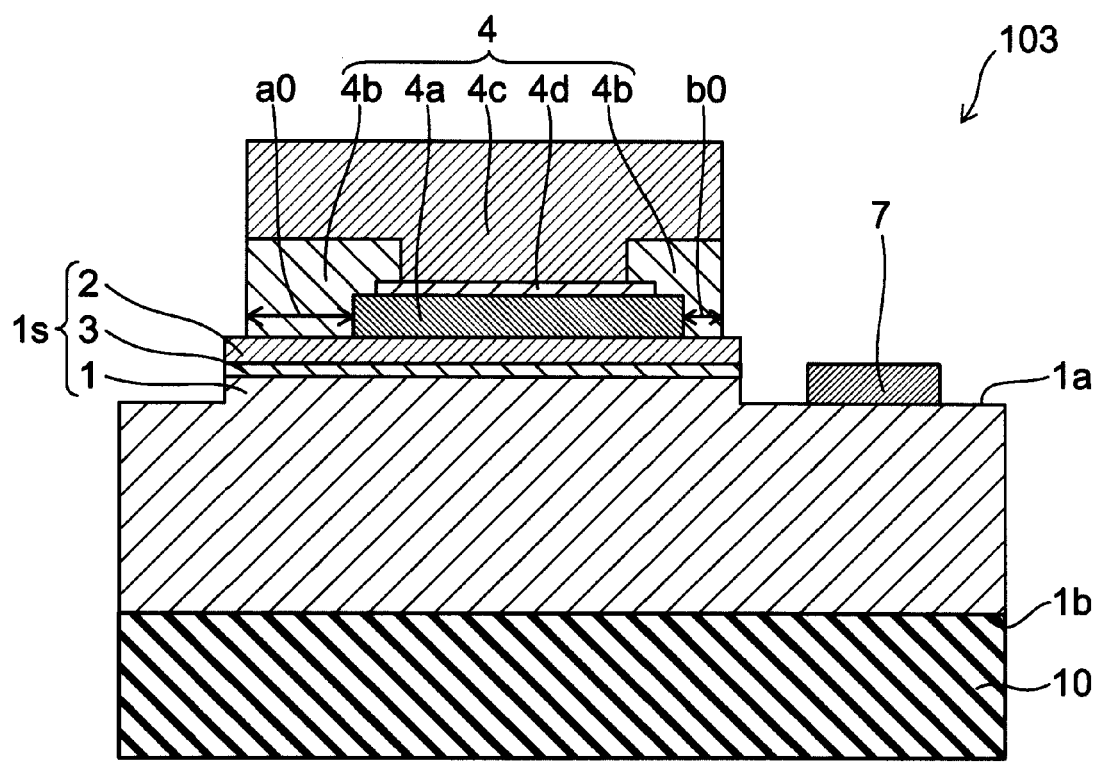
FIG. 6 is a schematic cross-sectional view illustrating the configuration of a semiconductor light emitting device according to a third embodiment of the invention.

FIG. 6 is a schematic cross-sectional view illustrating the configuration of a semiconductor light emitting device according to a third embodiment of the invention.

Also in a semiconductor light emitting device 103 according to the third embodiment of the invention illustrated in FIG. 6, the distance from the outer edge of the second film 4b to the first film 4a is shorter at the central portion than at the peripheral portion of the semiconductor light emitting device.

The distance from the outer edge of the second film 4b to the first film 4a is longer at the portion other than the portion where the n-side electrode 7 and the p-side electrode 4 oppose each other, that is, for example, the peripheral portion of the semiconductor light emitting device 103, than at the portion where the n-side electrode 7 and the p-side electrode 4 oppose each other.

The width of the region where the second film 4b contacts the p-type semiconductor layer 2 is narrower at the central portion than at the peripheral portion of the semiconductor light emitting device 103.

The third film 4c is provided in the semiconductor light emitting device 103 to cover the first film 4a exposed from the second film 4b and at least a portion of the second film 4b.

The second electrode 4 further includes a fourth film 4d provided between the third film 4c and the first film 4a and between the second film 4b and the first film 4a. The fourth film 4d may include a material to suppress materials included in at least one of the third film 4c and the second film 4b from diffusing into the first film 4a. Otherwise, the semiconductor light emitting device 103 may be similar to the semiconductor light emitting device 102 according to the second embodiment, and a description is omitted.

Although the fourth film 4d is provided both between the third film 4c and the first film 4a and between the second film 4b and the first film 4a in the specific example illustrated in FIG. 6, the invention is not limited thereto. In other words, the second electrode 4 may include the fourth film 4d provided between the first film 4a and at least one of the third film 4c and the second film 4b.

The fourth film 4d functions to prevent a material included in the second film 4b and/or the third film 4c from diffusing into the first film 4a or to prevent a material included in the second film 4b and/or the third film 4c from reacting with a material included in the first film 4a.

The fourth film 4d may include a material that does not react with silver or does not actively diffuse into silver. The fourth film 4d electrically contacts the first film 4a, the second film 4b, and the third film 4c.

Materials which may be used as the fourth film 4d include single-layer films or stacked films of a high melting-point metal usable as the diffusion prevention layer such as, for example, vanadium (V), chrome (Cr), iron (Fe), cobalt (Co), nickel (Ni), niobium (Nb), molybdenum (Mo), ruthenium (Ru), rhodium (Rh), tantalum (Ta), tungsten (W), rhenium (Re), osmium (Os), iridium (Ir), and platinum (Pt).

More favorable metals that have a high work function and easily provide ohmic connection characteristics with the p-type contact layer to prevent problems even in the case where some diffusion into the first film 4a occurs include iron (Fe), cobalt (Co), nickel (Ni), rhodium (Rh), tungsten (W), rhenium (Re), osmium (Os), iridium (Ir), and platinum (Pt).

It is favorable that the film thickness of the fourth film 4d is in the range of 5 nm to 200 nm to maintain the film state in the case of a single-layer film. In the case of a stacked film, the film thickness is not particularly limited, and may be, for example, 10 nm to 10,000 nm.

The semiconductor light emitting device 103 according to this embodiment having such a configuration may be fabricated as described below.

After forming the first film 4a, a patterned lift-off resist is formed in the region where the first film 4a is formed. Then, for example, six layers of a W/Pt stacked film are stacked as the fourth film 4d. The thickness of the entire six stacked (W/Pt) layers may be, for example, 900 nm.

Similarly, a patterned lift-off resist is formed with openings on the end of the region where the first film 4a is formed and the p-type contact layer where the first film 4a is not formed; the SiO$_2$ film on the p-type contact layer is removed by ammonium hydrogen fluoride treatment; and an Al/Ni/Au film, for example, is formed with a film thickness of 300 nm as the second film 4b. At this time, the second film 4b may be formed onto the fourth film 4d or may be formed not to contact the fourth film 4d.

A patterned lift-off resist is used similarly, and Pt/Au, for example, is formed with a film thickness of 500 nm as the third film 4c to cover the entire region in which the first film 4a is formed and not covered by the second film 4b, the entire surface of the fourth film 4d, and a portion of the second film 4b. Thereby, the p-side electrode 4 including the first, second, third, and fourth films 4a to 4d are formed.

Even in the case where AuSn solder and the like requiring a relatively high heat treatment temperature of at least 300° C. is used during fixation to a submount, the W/Pt stacked film, i.e., the fourth film 4d, of the semiconductor light emitting device 103 according to this embodiment functions as a barrier layer, and the third film 4c therefore does not diffuse into the Ag of the first film 4a.

Thus, by stacking high melting point metals having different linear coefficients of thermal expansion in thin films, a thick diffusion prevention layer can be realized while relieving strain.

After forming the p-side electrode 4, heat treatment at a temperature at or below the sintering temperature of the first film 4a may be performed to increase the adhesion of the entire p-side electrode 4.

Although Pt/Au was used as the third film 4c in this specific example, Ti/Pt/Au, for example, may be used to simultaneously form, for example, the n-side electrode 7. However, titanium (Ti) has a small work function and may cause worse ohmic characteristics of the first film 4a and an increase of the operating voltage in the case where Ti diffuses into the p-type contact layer. In this specific example, the W/Pt stacked film functions as a barrier layer. Therefore, Ti does not diffuse into the Ag of the first film 4a. Thereby, using the Ti/Pt/Au structure having good adhesion as the third film 4c improves the separation of the p-side electrode 4, improves the reliability and yield, and allows simultaneous formation of the n-side electrode 7. Therefore, manufacturing costs can be reduced.

Thus, the semiconductor light emitting device 103 according to this embodiment provides high light extraction efficiency, light output reproducibility, high reliability, and low manufacturing costs.

Fourth Embodiment

Figure 7:
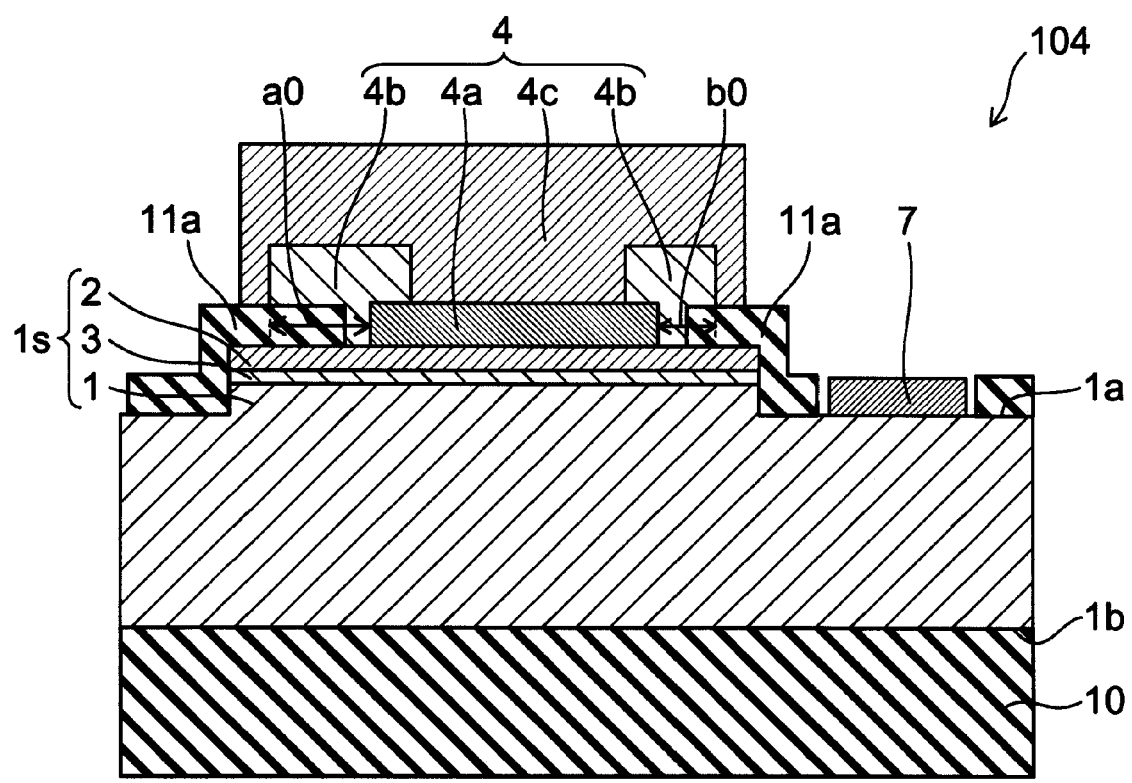
FIG. 7 is a schematic cross-sectional view illustrating the configuration of a semiconductor light emitting device according to a fourth embodiment of the invention.

FIG. 7 is a schematic cross-sectional view illustrating the configuration of a semiconductor light emitting device according to a fourth embodiment of the invention.

Also in a semiconductor light emitting device 104 according to the fourth embodiment of the invention illustrated in FIG. 7, the distance from the outer edge of the second film 4b to the first film 4a is shorter at the central portion than at the peripheral portion of the semiconductor light emitting device.

The distance from the outer edge of the second film 4b to the first film 4a is longer at the portion other than the portion where the n-side electrode 7 and the p-side electrode 4 oppose each other, that is, for example, the peripheral portion of the semiconductor light emitting device 104, than at the portion where the n-side electrode 7 and the p-side electrode 4 oppose each other.

In the semiconductor light emitting device 104, the third film 4c is provided to cover the second film 4b and the first film 4a exposed from the second film 4b. A dielectric film 11a is provided between the p-type semiconductor layer 2 and the second and third films 4b and 4c. An insulative, e.g., SiO₂, film may be used as the dielectric film 11a. Otherwise, the semiconductor light emitting device 104 may be similar to the semiconductor light emitting device 102 according to the second embodiment, and a description is omitted.

Thus, in the semiconductor light emitting device 104 according to this embodiment, the third film 4c covers the entire second film 4b and prevents deterioration of the second film 4b by exposure to ambient air.

The semiconductor light emitting device 104 according to this embodiment having such a configuration is fabricated as described below.

To form the p-side electrode 4, a patterned lift-off resist is formed on the semiconductor layers, and the SiO₂ film (the dielectric film) 11a on the p-type contact layer is removed by ammonium hydrogen fluoride treatment. A vacuum vapor deposition apparatus is used to form Ag forming the first film 4a with a film thickness of 200 nm in the region where the SiO₂ film was removed, and sintering is performed at 350° C. in a nitrogen atmosphere for one minute.

Similarly using a patterned lift-off resist, Al, for example, is formed with a film thickness of 300 nm as the second film 4b to cover the end of the region where Ag is formed, the entire region of the p-type contact layer exposed at the surface adjacent to the Ag, and a portion of the SiO₂ film.

Similarly using a patterned lift-off resist, Pt/Au, for example, is formed with a film thickness of 500 nm as the third film 4c to cover the entire region where Ag is formed and not covered by the second film 4b, the entire surface of the second film 4b, and a portion of the SiO₂ film. Thereby, the p-side electrode 4 including the first, second, and third films 4a to 4c is formed.

In the semiconductor light emitting device 104 according to this embodiment, the third film 4c covers the entire second film 4b to prevent native oxidation and migration of aluminum and realize reduced leak current, improved insulative properties, improved breakdown voltage, and improved reliability. Because the entire second film 4b is covered by the third film 4c, the second film 4b itself can be formed of single-layer aluminum, and manufacturing costs can be reduced.

In the semiconductor light emitting device 104 according to this embodiment, a region is disposed between the p-type contact layer and the second film 4b. Therefore, a weak electric field is applied between the p-type contact layer and the second film 4b on either side of the SiO₂ film. As a result, a structure can be made such that the electric field gradually decreases from the first film 4a to the SiO₂ film. Therefore, electric field concentration in this region is relieved and a longer life can be realized.

Thus, the semiconductor light emitting device 104 according to this embodiment provides high light extraction efficiency, high light output reproducibility, and a long life.

Fifth Embodiment

Figure 8:
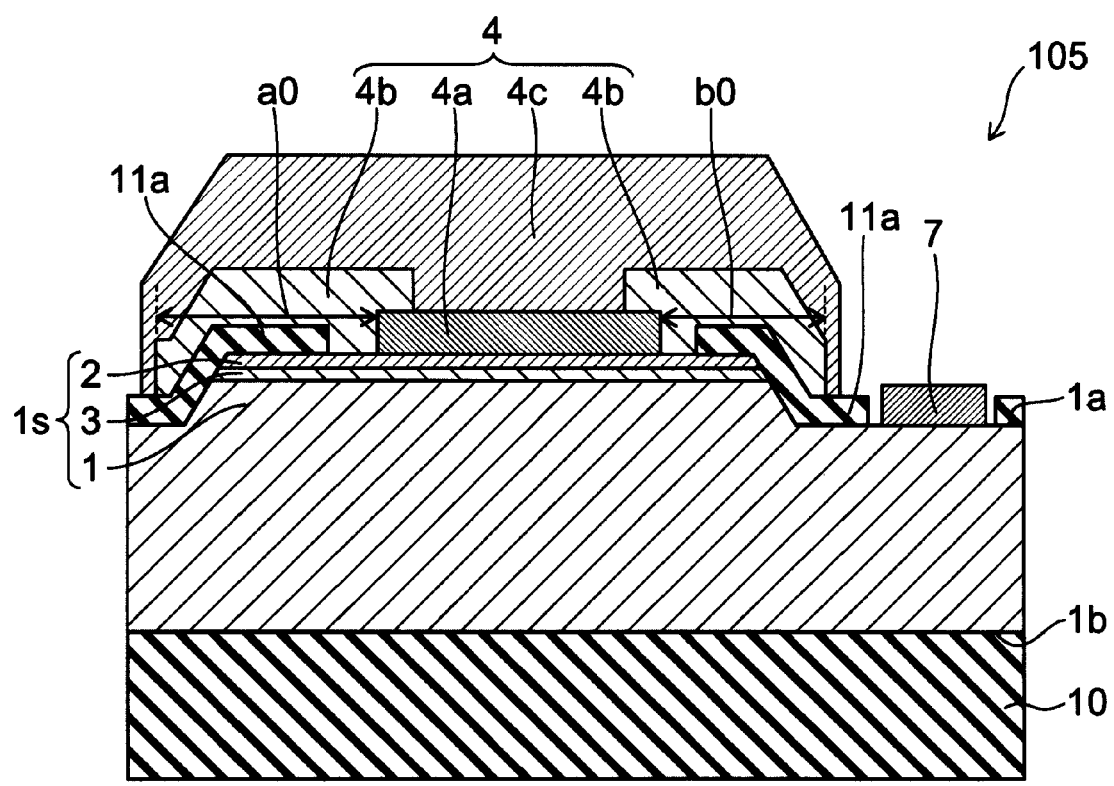
FIG. 8 is a schematic cross-sectional view illustrating the configuration of a semiconductor light emitting device according to a fifth embodiment of the invention.

FIG. 8 is a schematic cross-sectional view illustrating the configuration of a semiconductor light emitting device according to a fifth embodiment of the invention.

In the semiconductor light emitting device 105 according to the fifth embodiment of the invention illustrated in FIG. 8, the semiconductor layers disposed on either side of the light emitting layer 3 in the semiconductor light emitting device 104 according to the fourth embodiment have tapered cross sections. The dielectric film 11a and the second film 4b incline to cover the tapered portion. Otherwise, the semiconductor light emitting device 105 may be similar to the semiconductor light emitting device 104 according to the fourth embodiment, and a description is omitted.

Also in the semiconductor light emitting device 105, the distance from the outer edge of the second film 4b to the first film 4a is shorter at the central portion than at the peripheral portion of the semiconductor light emitting device.

The distance from the outer edge of the second film 4b to the first film 4a is longer at the portion other than the portion where the n-side electrode 7 and the p-side electrode 4 oppose each other, that is, for example, the peripheral portion of the semiconductor light emitting device 105, than at the portion where the n-side electrode 7 and the p-side electrode 4 oppose each other.

The refractive index difference between the nitride semiconductor layers and the sapphire substrate is large, and a portion of the emitted light reflects at the interface therebetween and returns to the semiconductor layers. This reflected light repeatedly reflects between the interface and the first and second films 4a and 4b and is confined in the semiconductor layers.

In such a case where the semiconductor layers are tapered as in this specific example, the reflection angle of light can be changed optically by total internal reflections or reflections by the metal reflecting films. Therefore, the probability of extracting light on the substrate side increases, and the light extraction efficiency improves.

Because the surface area of the second film 4b can be increased, the light extraction efficiency further improves in addition to the effects recited above.

By using the monocrystalline AlN buffer layer, absorption does not easily occur in the buffer layers, the defects in the semiconductor layers are dramatically reduced, the factors causing light absorption in the semiconductor layers can be reduced as much as possible, and the emitted light is repeatedly reflected over and over again in the semiconductor layers. Therefore, the effects of providing a tapered region that changes the reflection angle and the effects of increasing the high-efficiency reflecting region are further increased.

Providing the taper can suppress film separation due to the difference in levels.

Thus, the semiconductor light emitting device 105 according to this embodiment provides even higher light extraction efficiency and higher light output reproducibility.

Sixth Embodiment

Figure 9:
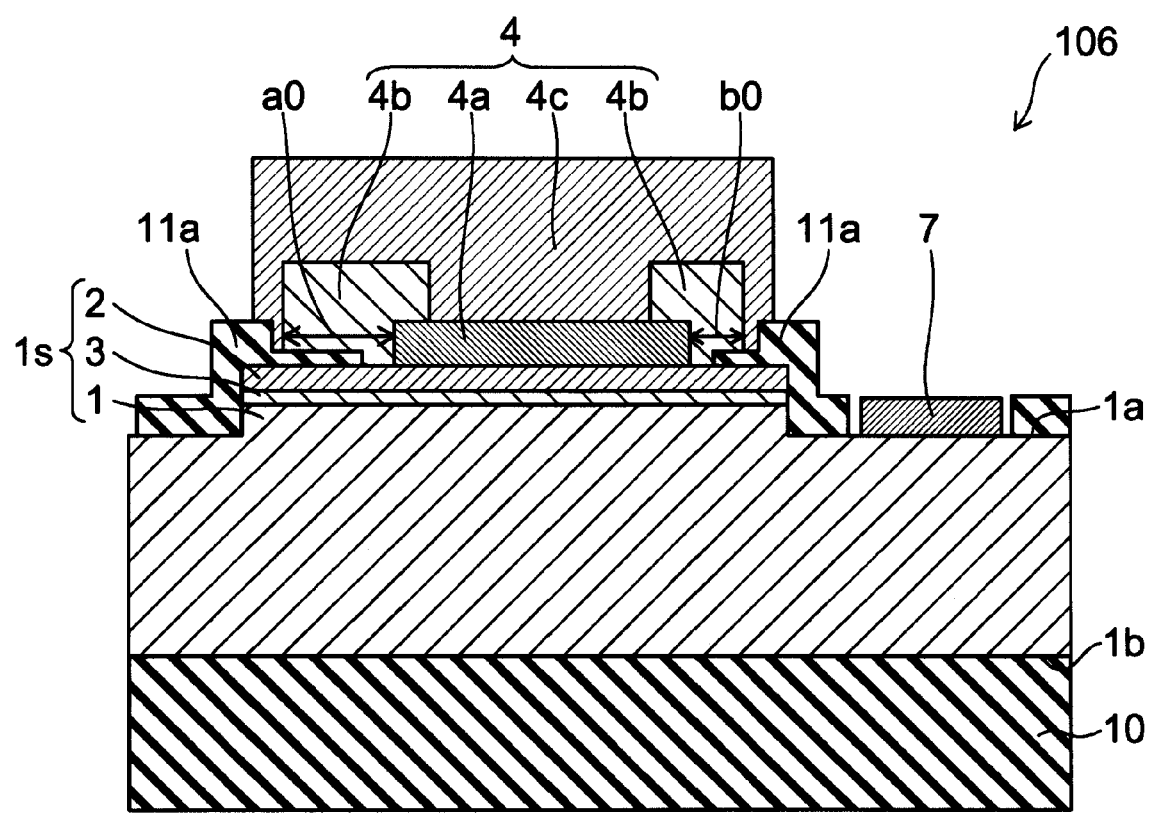
FIG. 9 is a schematic cross-sectional view illustrating the configuration of a semiconductor light emitting device according to a sixth embodiment of the invention.

FIG. 9 is a schematic cross-sectional view illustrating the configuration of a semiconductor light emitting device according to a sixth embodiment of the invention.

A semiconductor light emitting device 106 according to the sixth embodiment of the invention illustrated in FIG. 9 is different from the semiconductor light emitting device 104 according to the fourth embodiment in that the film thickness of the dielectric film 11a at the region covered by the second film 4b is thinner than the film thickness of the dielectric film 11a at the region exposed from the second film 4b. Otherwise, the semiconductor light emitting device 106 may be similar to the semiconductor light emitting device 104 according to the fourth embodiment, and a description is omitted.

Also in the semiconductor light emitting device 106, the distance from the outer edge of the second film 4b to the first film 4a is shorter at the central portion than at the peripheral portion of the semiconductor light emitting device.

The distance from the outer edge of the second film 4b to the first film 4a is longer at the portion other than the portion where the n-side electrode 7 and the p-side electrode 4 oppose each other, that is, for example, the peripheral portion of the semiconductor light emitting device 106, than at the portion where the n-side electrode 7 and the p-side electrode 4 oppose each other.

The formation of the electrodes on the semiconductor layers of the semiconductor light emitting device 106 according to this embodiment will now be described.

To form the p-side electrode 4, a patterned lift-off resist is formed on the semiconductor layers, and the $SiO_2$ film forming the dielectric film 11a on the p-type contact layer is removed by ammonium hydrogen fluoride treatment. A vacuum vapor deposition apparatus is used to form Ag as the first film 4a with a film thickness of 200 nm in the region where the $SiO_2$ film was removed. Sintering is performed at 350° C. in a nitrogen atmosphere for one minute.

Similarly, a patterned lift-off resist is formed to cover the end of the region where Ag is formed, the entire region of the p-type contact layer exposed at the surface adjacent to the Ag, and a portion of the $SiO_2$ film. Ammonium hydrogen fluoride treatment is performed as pre-processing for metal film deposition, and the end portion of the dielectric film 11a is etched. At this time, the ammonium hydrogen fluoride treatment time is adjusted such that the end portion of the dielectric film 11a made of the $SiO_2$ film exposed from the resist is not removed. Specifically, the time is not longer than one minute for an etching rate of 400 nm/min. Thereby, 400 nm of the $SiO_2$ film is removed, and the thickness of the end portion thereof is about 200 nm. Then, Al/Ni/Au is formed as the second film 4b with a film thickness of 300 nm.

Similarly, a patterned lift-off resist is formed to cover the entire region in which Ag is formed and not covered by the second film 4b, the entire second film 4b, and a portion of the dielectric film 11a. Pt/Au, for example, is formed with a film thickness of 500 nm as the third film 4c. Thereby, the p-side electrode 4 including the first, second, and third films 4a to 4c is formed. The n-side electrode 7 is formed by methods similar to the methods described above.

By reducing the film thickness of the dielectric film 11a disposed between the second film 4b and the p-type contact layer of the semiconductor light emitting device 106 according to this embodiment, the proportion of emitted light reflected by the second film 4b that is absorbed by the dielectric film 11a is reduced. As a result, the absorbing bodies in the semiconductor light emitting device 106 can be reduced, and the light extraction efficiency can be further improved.

The strength of the electric field applied to the dielectric film 11a can be adjusted by adjusting the film thickness of the dielectric film 11a (the $SiO_2$ film) disposed between the p-type contact layer and the second film 4b. As a result, the electric field distribution applied around the first film 4a can be adjusted to match the operating current, configuration, size, and arrangement of the semiconductor light emitting device 106, providing a semiconductor light emitting device having excellent electrical characteristics and high reliability.

Thus, the semiconductor light emitting device 106 according to this embodiment provides even higher light extraction efficiency and light output reproducibility, excellent electrical characteristics, and higher reliability.

Seventh Embodiment

Figure 10A:
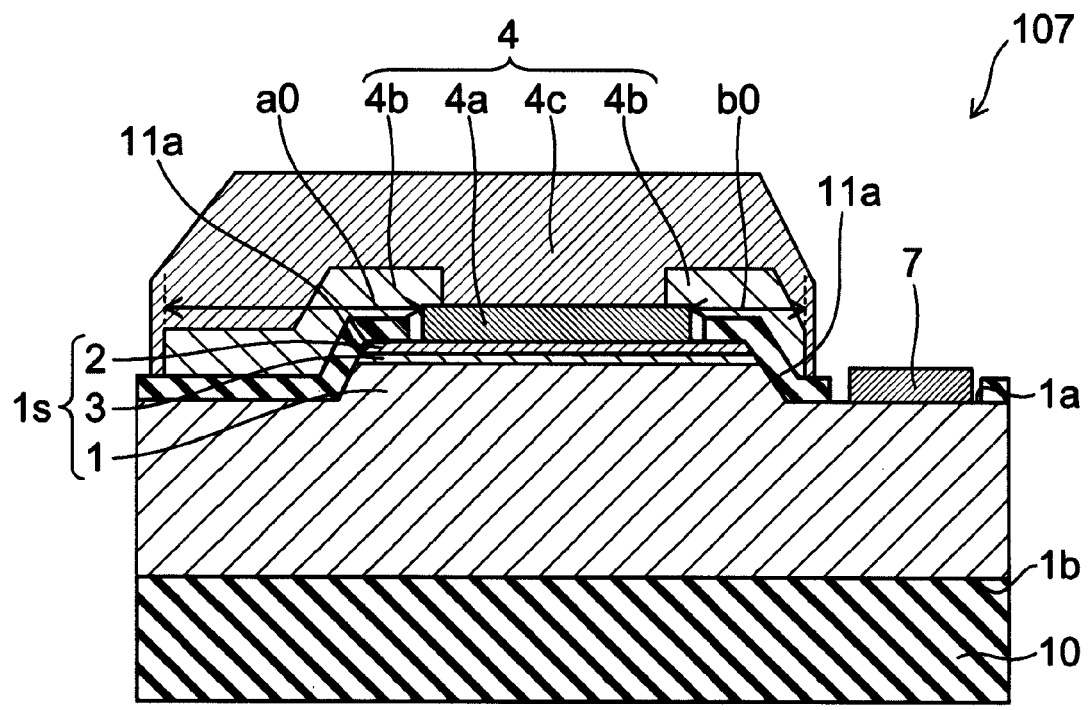
FIGS. 10A and 10B are schematic views illustrating the configuration of a semiconductor light emitting device according to a seventh embodiment of the invention.
Figure 10B:
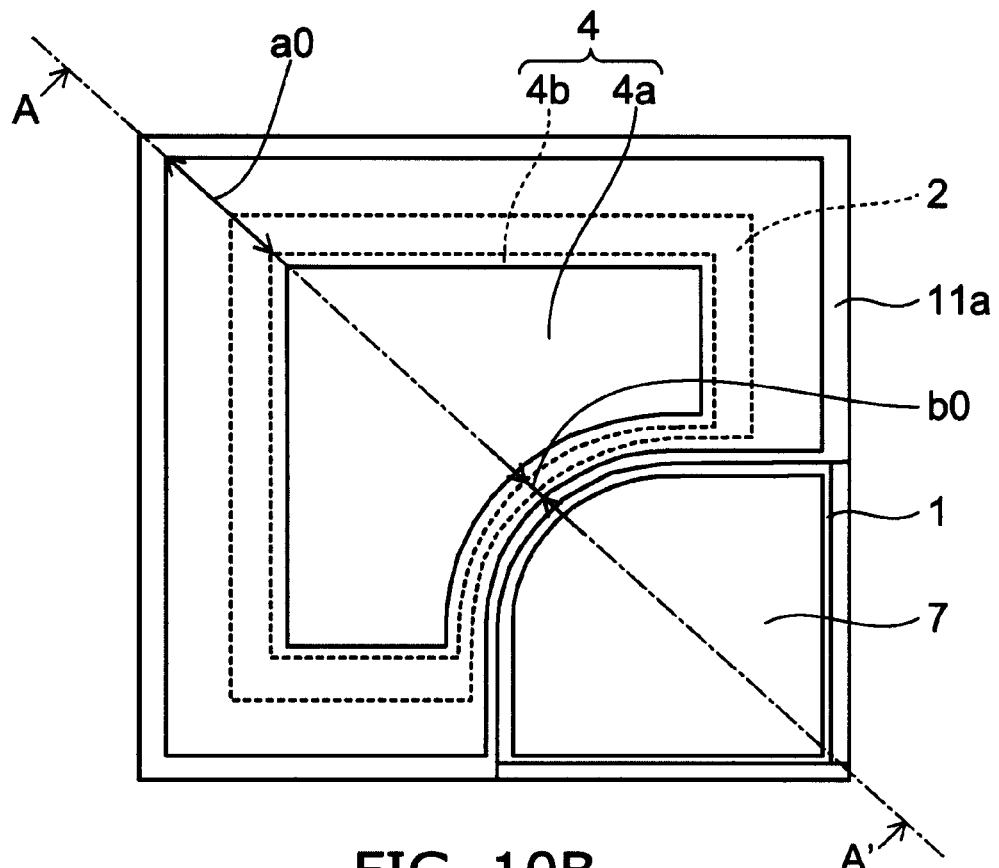

FIGS. 10A and 10B are schematic views illustrating the configuration of a semiconductor light emitting device according to a seventh embodiment of the invention.

Namely, FIG. 10B is a plan view, and FIG. 10A is a cross-sectional view along line A-A' of FIG. 10B. The third film 4c is omitted in FIG. 10B.

The surface area of the p-type contact layer (i.e., the p-type semiconductor layer 2) of a semiconductor light emitting device 107 according to the seventh embodiment of the invention illustrated in FIGS. 10A and 10B is relatively small in comparison to that of the semiconductor light emitting device 105 according to the fifth embodiment. Otherwise, the semiconductor light emitting device 107 may be similar to the semiconductor light emitting device 105 according to the fifth embodiment, and a description is omitted.

Also in the semiconductor light emitting device 107, the distance from the outer edge of the second film 4b to the first film 4a is shorter at the central portion than at the peripheral portion of the semiconductor light emitting device.

The distance from the outer edge of the second film 4b to the first film 4a is longer at the portion other than the portion where the n-side electrode 7 and the p-side electrode 4 oppose each other, that is, for example, the peripheral portion of the semiconductor light emitting device 107, than at the portion where the n-side electrode 7 and the p-side electrode 4 oppose each other.

The semiconductor light emitting device 107 according to this embodiment differs from the semiconductor light emitting device 105 described above in that the surface area of the p-type contact layer (i.e., the p-type semiconductor layer 2) is made smaller corresponding to the first film 4a by the etching process that exposes the n-type contact layer.

Reducing the surface area of the light emitting layer 3 not contributing to light emission can prevent emitted light repeatedly reflecting in the semiconductor layers from being absorbed by non-activated portions of the light emitting layer, and the light output therefore improves.

Eighth Embodiment

Figure 11A:
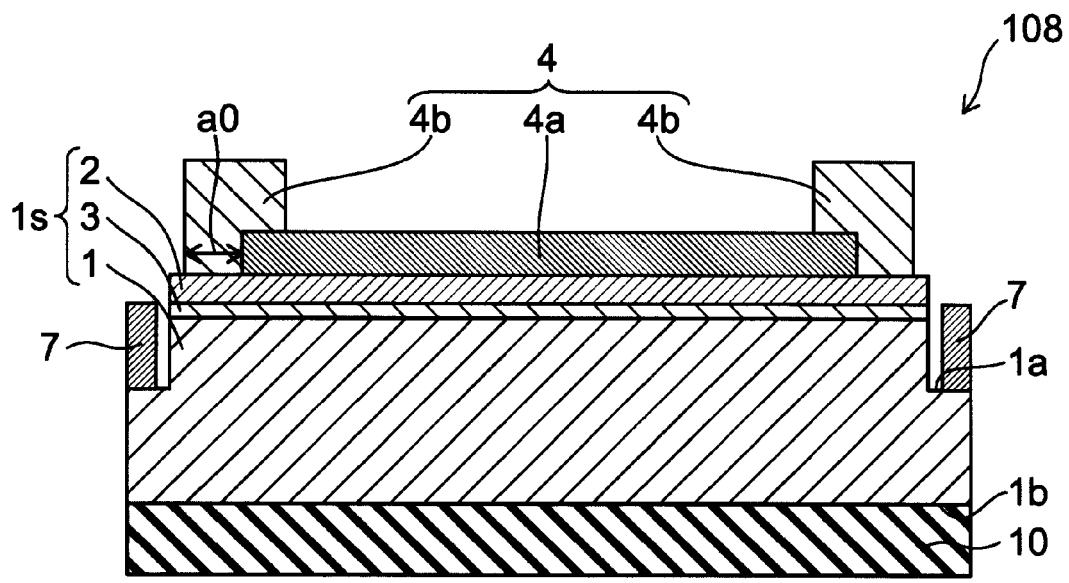
FIGS. 11A and 11B are schematic views illustrating the configuration of a semiconductor light emitting device according to an eighth embodiment of the invention.
Figure 11B:
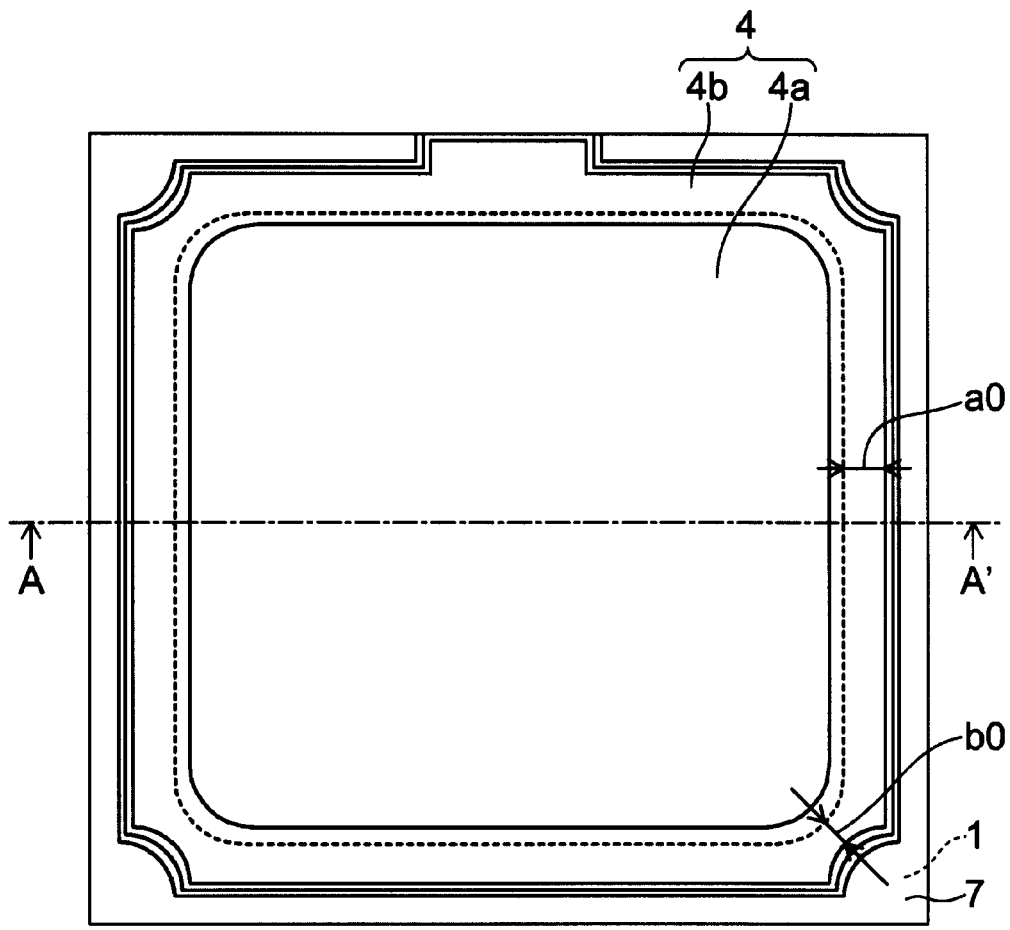

FIGS. 11A and 11B are schematic views illustrating the configuration of a semiconductor light emitting device according to an eighth embodiment of the invention.

Namely, FIG. 11B is a plan view, and FIG. 11A is a cross-sectional view along line A-A' of FIG. 11B.

In a semiconductor light emitting device 108 according to the eighth embodiment of the invention illustrated in FIGS. 11A and 11B, the n-side electrode 7 is provided to enclose the p-side electrode 4. The size of the semiconductor light emitting device 108 is 1,000 μm by 1,000 μm with a device thickness of 100 μm.

Also in the semiconductor light emitting device 108, the distance from the outer edge of the second film 4b to the first film 4a is shorter at the central portion than at the peripheral portion of the semiconductor light emitting device.

In other words, the n-side electrode 7 of the semiconductor light emitting device 108 is provided to enclose the p-side electrode 4. The width of the n-side electrode 7 is wider at the corner portions than at the side portions to allow easier connection of the corner portions of the semiconductor light emitting device 108 to other wiring. The larger surface area of the n-side electrode 7 at the corner portions results in the outer edge of the second film 4b being positioned more toward the central portion side of the semiconductor light emitting device 108 at the corner portions than at the side portions of the semiconductor light emitting device 108.

In the semiconductor light emitting device 108 having such a configuration, the distance from the outer edge of the second film 4b to the first film 4a at the peripheral portion is the width a0 at the side portion; and the distance from the outer edge of the second film 4b to the first film 4a at the central portion is the width b0 at the corner portion. The width b0 is narrower than the width a0.

According to the semiconductor light emitting device 108 according to this embodiment, the second film 4b is formed in a region excluding the minimum region necessary for the n-side electrode 7 while realizing a current injection structure having a high light extraction efficiency. Thereby, the reflecting region is increased as much as possible.

As described in the fifth embodiment, the semiconductor layers disposed on either side of the light emitting layer 3 in the semiconductor light emitting device 108 have tapered cross sections, and the dielectric film 11a and the second film 4b are inclined to cover the tapered portion.

In the case where the ratio of the width to the thickness of the device is high as in the semiconductor light emitting device 108 according to this embodiment, more multiple reflections are repeated in the device. Therefore, providing a taper to change the reflection angle of light further increases the effects of improving the light extraction efficiency.

Ninth Embodiment

Figure 12A:
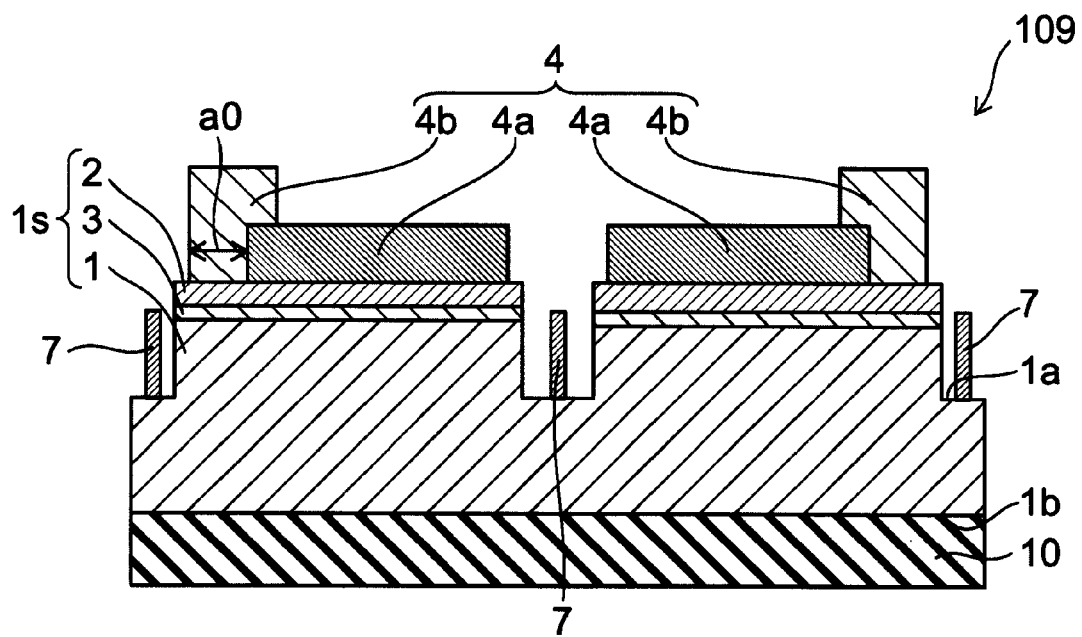
FIGS. 12A and 12B are schematic views illustrating the configuration of a semiconductor light emitting device according to a ninth embodiment of the invention.
Figure 12B:
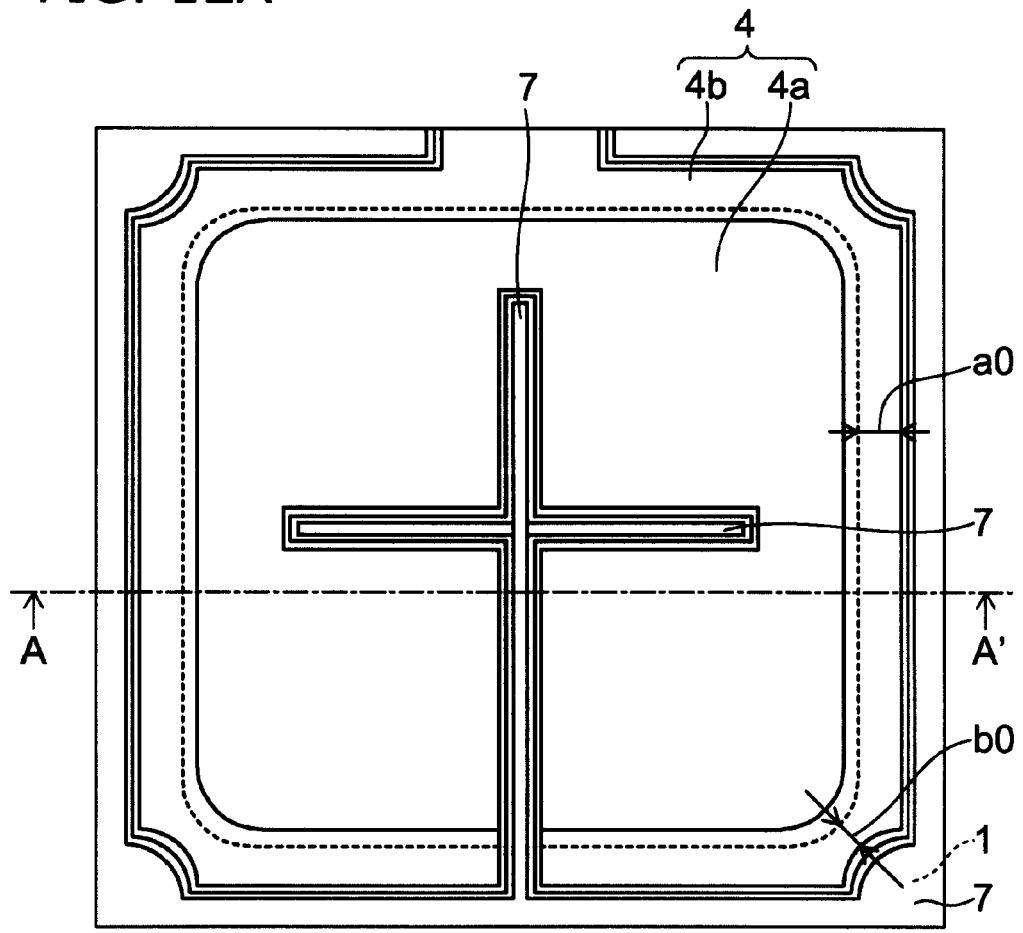

FIGS. 12A and 12B are schematic views illustrating the configuration of a semiconductor light emitting device according to a ninth embodiment of the invention.

Namely, FIG. 12B is a plan view, and FIG. 12A is a cross-sectional view along line A-A' of FIG. 12B.

In a semiconductor light emitting device 109 according to the ninth embodiment of the invention illustrated in FIGS. 12A and 12B, the n-side electrode 7 is provided to enclose the p-side electrode 4 and is further provided in the central portion of the semiconductor light emitting device 109.

Thus, by forming the n-side electrode 7 in the central portion in addition to the peripheral portion of the device, the distance from the p-side electrode 4 to the n-side electrode 7 can be made substantially shorter. Therefore, the electrical characteristics improve, the n-type contact layer can be designed thin without greatly affecting electrical characteristics, and the crystal growth time and costs can be reduced. The current concentration of the p-side electrode 4 during high current injection is relieved, and the light emitting region of the p-side electrode 4 is thereby increased. Thereby, the light output and reliability can be improved.

The second film 4b is not provided in the p-side electrode 4 at the central portion of the device. The first film 4a opposing the n-side electrode 7 in this region can be formed to the end of the p-type contact layer as much as process conditions such as exposure precision permit. Thereby, light output characteristics can be improved by increasing the light emitting region in regions around the center of the device, and electrical characteristics can be improved by increasing the ohmic surface area.

Also in the semiconductor light emitting device 109, the distance from the outer edge of the second film 4b to the first film 4a is shorter at the central portion than at the peripheral portion of the semiconductor light emitting device.

In other words, in the semiconductor light emitting device 109 as well, the n-side electrode 7 is provided to enclose the p-side electrode 4 and is wider at the corner portions than at the side portions. The outer edge of the second film 4b is positioned more toward the central portion of the semiconductor light emitting device 109 at the corner portions than at the side portions of the semiconductor light emitting device 109.

The distance from the outer edge of the second film 4b to the first film 4a at the peripheral portion is the width a0 at the side portion; and the distance from the outer edge of the second film 4b to the first film 4a at the central portion is the width b0 at the corner portion. The width b0 is narrower than the width a0.

Tenth Embodiment

Figure 13A:
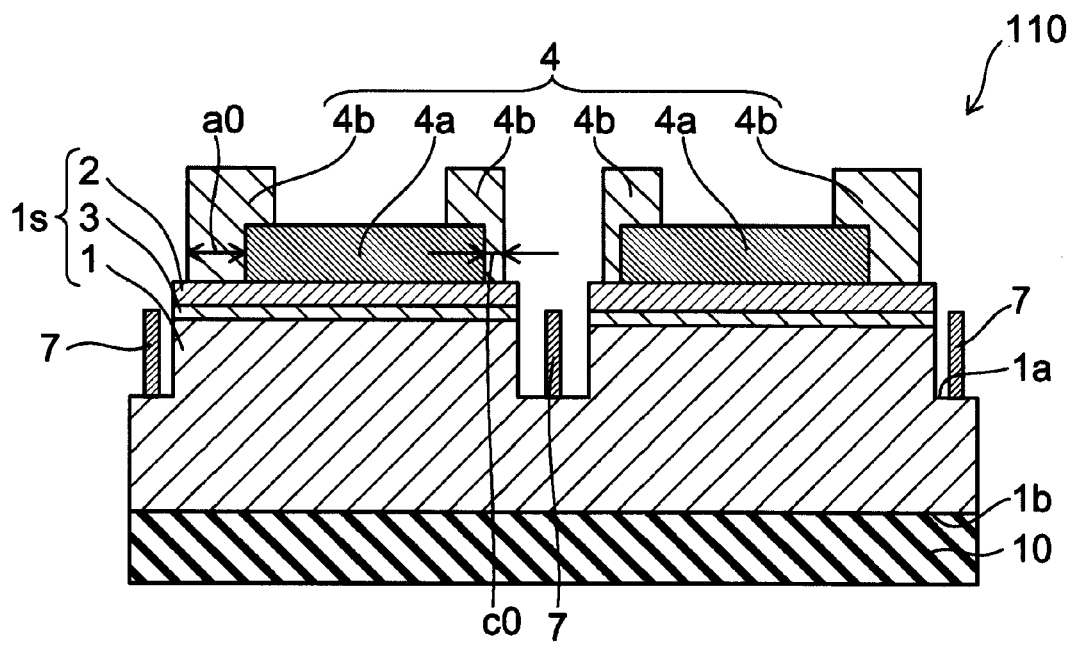
FIGS. 13A and 13B are schematic views illustrating the configuration of a semiconductor light emitting device according to a tenth embodiment of the invention.
Figure 13B:
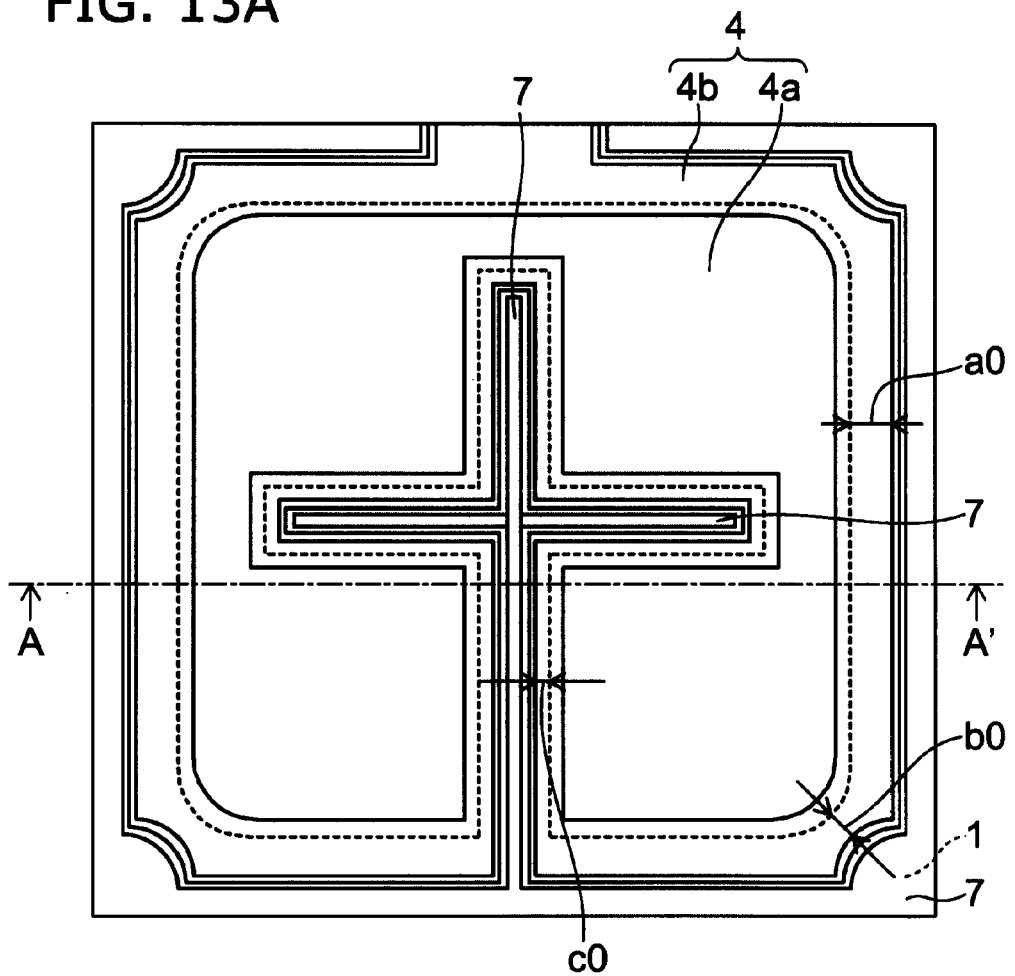

FIGS. 13A and 13B are schematic views illustrating the configuration of a semiconductor light emitting device according to a tenth embodiment of the invention.

Namely, FIG. 13B is a plan view, and FIG. 13A is a cross-sectional view along line A-A' of FIG. 13B.

In a semiconductor light emitting device 110 according to the tenth embodiment of the invention illustrated in FIGS. 13A and 13B, the n-side electrode 7 is provided to enclose the p-side electrode 4. The n-side electrode 7 is provided also in the central portion of the semiconductor light emitting device 110. The second film 4b is provided also in the region around the n-side electrode 7 formed in the central portion of the semiconductor light emitting device 110.

Also in the semiconductor light emitting device 110, the distance from the outer edge of the second film 4b to the first film 4a is shorter at the central portion than at the peripheral portion of the semiconductor light emitting device.

In other words, in the semiconductor light emitting device 110 as well, the n-side electrode 7 is provided to enclose the p-side electrode 4 and is wider at the corner portions than at the side portions. The outer edge of the second film 4b is positioned more toward the central portion of the semiconductor light emitting device 110 at the corner portions than at the side portions of the semiconductor light emitting device 110.

The distance from the outer edge of the second film 4b to the first film 4a at the peripheral portion is the width a0 at the side portion; and the distance from the outer edge of the second film 4b to the first film 4a at the central portion is the width b0 at the corner portion. The width b0 is narrower than the width a0.

A larger light emitting region around the center of the device increases the light extraction efficiency. Therefore, it is favorable that a width c0 of the second film 4b formed in the central portion of the device is narrower than the width a0 of the second film 4b formed proximal to the outer circumference of the device to increase the surface area of the first film 4a.

In other words, in the semiconductor light emitting device 110, the p-side electrode 4 is provided in a region of the semiconductor light emitting device 110 excluding the central portion; the n-side electrode 7 is provided in the central portion of the semiconductor light emitting device 110 where the p-side electrode 4 is not provided while enclosing the p-side electrode 4; and the distance from the outer edge of the second film 4b to the first film 4a is shorter at the central portion (e.g., the width c0) than at the peripheral portion (e.g., the width a0) of the semiconductor light emitting device 110.

Although the width c0 at the portion where the n-side electrode 7 provided in the central portion opposes the p-side electrode 4 is smaller than the width b0 of the central portion in this specific example, it is sufficient that the width c0 is smaller than the width a0 of the peripheral portion.

Thereby, the reflecting region can be increased as much as possible by forming the second film 4b in the region excluding the minimum necessary region for the n-side electrode 7 while realizing a current injection structure having a high light extraction efficiency.

The semiconductor light emitting device 110 according to this embodiment also may have a configuration such as that described in the fifth embodiment in which the cross sections of the semiconductor layers disposed on either side of the light emitting layer 3 are patterned into a tapered configuration and the dielectric film 11a and the second film 4b are inclined to cover the tapered portion.

In the case where the aspect ratio of width to thickness of the device is high as in the semiconductor light emitting device 110 according to this embodiment, the number of reflections of light emitted and reflected in the semiconductor layers increases, and the effects of the tapered portion that changes the reflection angle increase. Therefore, the light extraction efficiency is greatly increased by forming the second film 4b in the central portion of the device and forming the tapered configuration.

Eleventh Embodiment

Figure 14:
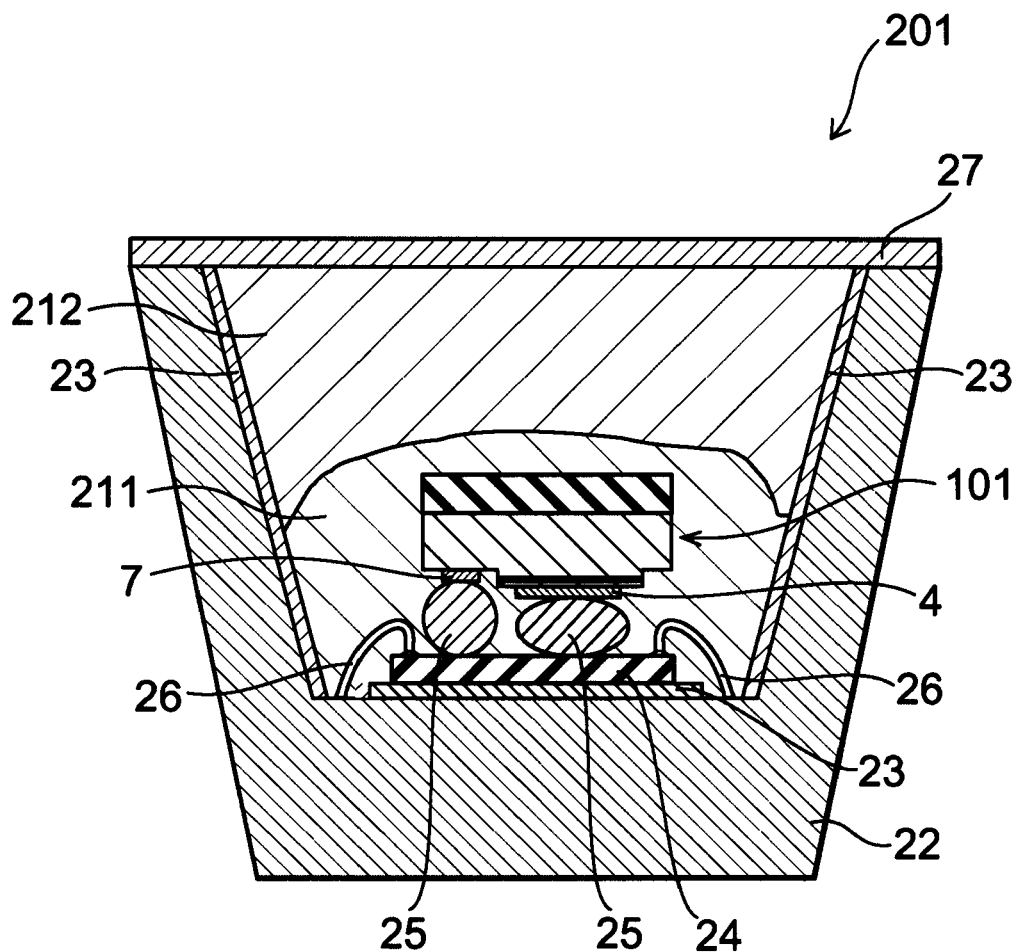
FIG. 14 is a schematic cross-sectional view illustrating the configuration of a semiconductor light emitting apparatus according to an eleventh embodiment of the invention.

FIG. 14 is a schematic cross-sectional view illustrating the configuration of a semiconductor light emitting apparatus according to an eleventh embodiment of the invention.

A semiconductor light emitting apparatus 201 according to the eleventh embodiment of the invention illustrated in FIG. 14 is a white LED combining a fluorescent body and any of the semiconductor light emitting devices 101 to 110 according to the embodiments recited above. In other words, the semiconductor light emitting apparatus 201 according to this embodiment includes any of the semiconductor light emitting devices recited above and a fluorescent body that absorbs a first light emitted from the semiconductor light emitting device and emits a second light having a different wavelength than the first light.

Hereinbelow, the case is assumed where the semiconductor light emitting device 101 recited above is combined with fluorescent bodies.

In the semiconductor light emitting apparatus 201 according to this embodiment illustrated in FIG. 14, reflecting films 23 are provided on inner faces of a container 22 made of a ceramic or the like. The reflecting films 23 are provided separately on an inner side face and a bottom face of the container 22. The reflecting films 23 are made of, for example, aluminum and the like. The semiconductor light emitting device 101 is disposed on the reflecting film 23 provided on the bottom portion of the container 22 via a submount 24.

Gold bumps 25 are formed on the semiconductor light emitting device 101 by, for example, a ball bonder. The semiconductor light emitting device 101 is fixed to the submount 24. Fixation directly to the submount is possible without using gold bumps.

Bonding by a bonding agent, solder, etc., may be used to fix the semiconductor light emitting device 101, the submount 24, and the reflecting film 23.

Patterned electrodes are formed on the surface of the submount 24 on the semiconductor light emitting device side to insulate the p-side electrode 4 and the n-side electrode 7 of the semiconductor light emitting device 101. Each of the electrodes is connected to a not-illustrated electrode provided on the container 22 by bonding wires 26. The connection is made to the portion between the reflecting film 23 of the inner side face and the reflecting film 23 of the bottom face.

A first fluorescent body layer 211 including a red fluorescent body is provided to cover the semiconductor light emitting device 101 and the bonding wires 26. A second fluorescent body layer 212 including a blue, green, or yellow fluorescent body is formed on the first fluorescent body layer 211. A lid 27 made of silicon resin is provided on the fluorescent body layer.

The first fluorescent body layer 211 includes a resin and the red fluorescent body dispersed in the resin.

The red fluorescent body may include, for example, an activating substance of trivalent Eu ($Eu^{3+}$) in a main material such as $Y_2O_3$, $YVO_4$, or $Y_2(P, V)O_4$. In other words, $Y_2O_3$:$Eu^{3+}$, $YVO_4$:$Eu^{3+}$, and the like may be used as the red fluorescent body. The molar concentration of $Eu^{3+}$ may be 1% to 10%. LaOS, $Y_2(P, V)O_4$, and the like may be used as the main material of the red fluorescent body in addition to $Y_2O_3$ and $YVO_4$. $Mn^{4+}$ and the like may be utilized in addition to $Eu^{3+}$.

In particular, absorption at 380 nm increases by adding a small amount of Bi with trivalent Eu to the $YVO_4$ main body. Therefore, the luminous efficacy increases even more. A silicon resin and the like, for example, may be used as the resin.

The second fluorescent body layer 212 includes a resin and at least one of a blue fluorescent body, a green fluorescent body, and a yellow fluorescent body dispersed in the resin. For example, a fluorescent body combining a blue fluorescent body and a green fluorescent body, a fluorescent body combining a blue fluorescent body and a yellow fluorescent body, or a fluorescent body combining a blue fluorescent body, a green fluorescent body, and a yellow fluorescent body may be used.

$(Sr, Ca)_{10}(PO_4)_6Cl_2:Eu^{2+}$, $BaMg_2Al_{16}O_{27}:Eu^{2+}$, and the like, for example, may be used as the blue fluorescent body.

$Y_2SiO_5:Ce^{3+}$, $Tb^{3+}$ having centers of light emission of trivalent Tb, for example, may be used as the green fluorescent body. In such a case, energy is transmitted from Ce ions to Tb ions to improve the excitation efficiency. $Sr_4Al_{14}O_{25}:Eu^{2+}$ and the like, for example, may be used as the green fluorescent body.

$Y_3Al_5:Ce^{3+}$ and the like, for example, may be used as the yellow fluorescent body.

A silicon resin and the like, for example, may be used as the resin.

In particular, trivalent Tb exhibits a sharp light emission around 550 nm at which visibility is at a maximum and thereby markedly improves the luminous efficacy when combined with the sharp red light emission of trivalent Eu.

According to the semiconductor light emitting apparatus 201 according to this embodiment, ultraviolet light of 380 nm emitted by the semiconductor light emitting device 101 is emitted to the substrate 10 side of the semiconductor light emitting device 101 and efficiently excites the fluorescent bodies recited above included in the fluorescent body layers by utilizing also reflections of the reflecting films 23.

For example, the fluorescent body recited above having centers of light emission of trivalent Eu and the like included in the first fluorescent body layer 211 converts light into light having a narrow wavelength distribution around 620 nm to efficiently produce red visible light.

The blue, green, and yellow fluorescent bodies included in the second fluorescent body layer 212 are efficiently excited and efficiently produce blue, green, and yellow visible light.

Mixing such colors produces white light and light of other various colors with high efficiency and good color rendition.

The method for manufacturing the semiconductor light emitting apparatus 201 according to this embodiment will now be described.

The methods described above may be used in the processes that fabricate the semiconductor light emitting device 101. Therefore, the processes after completion of the semiconductor light emitting device 101 will now be described.

First, a metal film forming the reflecting film 23 is formed on the inner face of the container 22 by, for example, sputtering. The metal film is patterned, and the reflecting film 23 is left on each of the inner side face and the bottom face of the container 22.

Then, the gold bumps 25 are formed on the semiconductor light emitting device 101 by a ball bonder, and the semiconductor light emitting device 101 is fixed on the submount 24 having patterned electrodes for the p-side electrode 4 and the n-side electrode 7. The submount 24 is disposed and fixed on the reflecting film 23 on the bottom face of the container 22. Bonding using a bonding agent, solder, etc., may be used for the fixation. It is also possible to directly fix the semiconductor light emitting device 101 on the submount 24 without using the gold bumps 25 formed by the ball bonder.

Continuing, each of a not-illustrated n-side electrode and p-side electrode on the submount 24 is connected to a not-illustrated electrode provided on the container 22 by bonding wires 26.

The first fluorescent body layer 211 including the red fluorescent body is then formed to cover the semiconductor light emitting device 101 and the bonding wires 26. The second fluorescent body layer 212 including the blue, the green, or the yellow fluorescent body is formed on the first fluorescent body layer 211.

The method for forming each of the fluorescent body layers may drop resin/source material mixture solutions having the fluorescent bodies dispersed therein and perform heat treatment to cure the resin by thermal polymerization. It is possible to cause the fine particles of the fluorescent bodies to distribute unevenly in the lower layers of the first and second fluorescent body layers 211 and 212 to appropriately control the luminous efficacy of each of the fluorescent bodies by allowing the resin/source material mixture solutions containing the fluorescent bodies to lie for a while after dropping and prior to curing to allow the fine particles of the fluorescent bodies to settle. Subsequently, the lid 27 is provided on the fluorescent body layer, and the semiconductor light emitting apparatus 201 according to this embodiment, that is, the white LED, is fabricated.

As described above, any of the semiconductor light emitting devices 101 to 110 according to the embodiments recited above may be used in the semiconductor light emitting apparatus 201 according to this embodiment.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) for which each of the composition ratios x, y, and z are changed within the respective ranges. Further, "nitride semiconductor" includes semiconductors of the chemical formula recited above further containing group V elements other than N (nitrogen) and/or any of various dopants added to control the conductivity type, etc.

Hereinabove, exemplary embodiments of the invention are described with reference to specific examples. However, the invention is not limited to these specific examples. For example, one skilled in the art may appropriately select configurations, sizes, material qualities, arrangements, etc., of components of semiconductor multiple-layer films, metal films, dielectric films, etc., of semiconductor light emitting devices or manufacturing methods from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all semiconductor light emitting devices and semiconductor light emitting apparatuses obtainable by an appropriate design modification by one skilled in the art based on the semiconductor light emitting devices and the semiconductor light emitting apparatuses described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A semiconductor light emitting device, comprising:
   a stacked structure unit including a first semiconductor layer, a second semiconductor layer, and a light emitting layer provided between the first semiconductor layer and the second semiconductor layer;
   a first electrode provided on a first major surface of the stacked structure unit on the second semiconductor layer side to connect to the first semiconductor layer; and
   a second electrode provided on the first major surface of the stacked structure unit to connect to the second semiconductor layer,
   the second electrode including:
      a first film provided on the second semiconductor layer, the first film being physically in contact with the second semiconductor layer, the first film having a first contact resistance with the second semiconductor layer; and
      a second film provided along a rim of the first film, on the rim, and on the second semiconductor layer, a part of the second film being in contact with the second semiconductor layer, the second film having a second contact resistance with the second semiconductor layer, the second contact resistance being higher than the first contact resistance,
   a maximum value of a first distance from an outer edge of the second film to the first film at a first region being smaller than a minimum value of a second distance from the outer edge of the second film to the first film at a second region, the first region being between the first film and the first electrode, the second region being a portion where the first film does not oppose the first electrode.

2. The device according to claim 1, wherein
   the first major surface includes:
      a first portion, and
      a second portion provided along an outer edge of the first major surface and surrounding the first portion, a distance from the outer edge of the first major surface to the second portion is shorter than a distance from the outer edge of the first major surface to the first portion,
   a first width of a region where the second film contacts the second semiconductor layer in the first portion is narrower than a second width of a region where the second film contacts the second semiconductor layer in the second portion.

3. The device according to claim 1, wherein the first film is ohmic with respect to the second semiconductor layer and the second film is non-ohmic with respect to the second semiconductor layer.

4. The device according to claim 1, wherein the first film includes silver or silver alloy.

5. The device according to claim 1, wherein the second film includes Al or Al alloy.

6. The device according to claim 1, wherein a first width of a region where the second film contacts the second semiconductor layer in the first region is narrower a second width of a region where the second film contacts the second semiconductor layer in the second region.

7. The device according to claim 6, wherein the second film is refractive.

8. The device according to claim 1, wherein
   the first major surface includes:
      a first portion, and
      a second portion provided along an outer edge of the first major surface and surrounding the first portion, a distance from the outer edge of the first major surface to the second portion is shorter than a distance from the outer edge of the first major surface to the first portion,
   a distance from the outer edge of the second film to the first film at the first portion is smaller than a distance from the outer edge of the second film to the first film at a second portion.

9. The device according to claim 6, wherein the second film is refractive.

* * * * *